United States Patent [19]

Mori et al.

[11] Patent Number: 5,404,111

[45] Date of Patent: Apr. 4, 1995

[54] PROBE APPARATUS WITH A SWINGING HOLDER FOR AN OBJECT OF EXAMINATION

[75] Inventors: Shigeoki Mori, Ayase, Japan; Wataru Karasawa, Cupertino, Calif.; Hitoshi Fujihara, Yamanashi, Japan; Masaru Suzuki, Kofu, Japan; Keiichi Yokota, Nirasaki, Japan

[73] Assignees: Tokyo Electron Limited, Tokyo; Tokyo Electron Yamanashi Limited, Nirasaki, both of Japan

[21] Appl. No.: 77,392

[22] Filed: Jun. 17, 1993

Related U.S. Application Data

[63] Continuation-in-part of Ser. No. 923,539, Aug. 3, 1992, Pat. No. 5,321,453.

[30] Foreign Application Priority Data

| Aug. 3, 1991 | [JP] | Japan | 3-216648 |
| Aug. 3, 1991 | [JP] | Japan | 3-216649 |
| Aug. 3, 1991 | [JP] | Japan | 3-216650 |
| Sep. 5, 1991 | [JP] | Japan | 3-254638 |
| Jun. 17, 1992 | [JP] | Japan | 4-183033 |
| Sep. 29, 1992 | [JP] | Japan | 4-283758 |

[51] Int. Cl.[6] .................................... G01R 31/02
[52] U.S. Cl. .......................................... 324/758
[58] Field of Search ............. 324/158 R, 158 F, 73.1, 324/758, 760; 356/400, 401; 348/141, 87, 126

[56] References Cited

U.S. PATENT DOCUMENTS

| 4,588,346 | 5/1986 | Smith | 324/158 F |
| 4,705,447 | 11/1987 | Smith | 324/158 F |
| 4,746,857 | 5/1988 | Sakai et al. | 324/158 F |
| 4,786,867 | 11/1988 | Yamatsu | 324/158 F |
| 4,929,893 | 5/1990 | Sato et al. | 324/158 F |
| 4,943,767 | 1/1990 | Yokota | 324/158 F |
| 4,965,515 | 10/1990 | Karasawa | 324/158 R |
| 4,985,676 | 1/1991 | Karasawa | 324/158 R |
| 5,204,617 | 4/1993 | Kumagai | 324/158 R |

*Primary Examiner*—Vinh Nguyen
*Attorney, Agent, or Firm*—Oblon, Spivak, McClelland, Maier & Neustadt

[57] ABSTRACT

A probe apparatus which has a probe card having a plurality of probes, a wafer holder located above or beside the probe card, for holding a wafer to be examined, a tester head electrically connected to the probes of the probe card, a tester electrically connected to the tester head, for detecting electrical characteristics of the wafer from the data output from the wafer, and a CCD camera arranged to oppose the object, for detecting the position of the wafer.

11 Claims, 19 Drawing Sheets

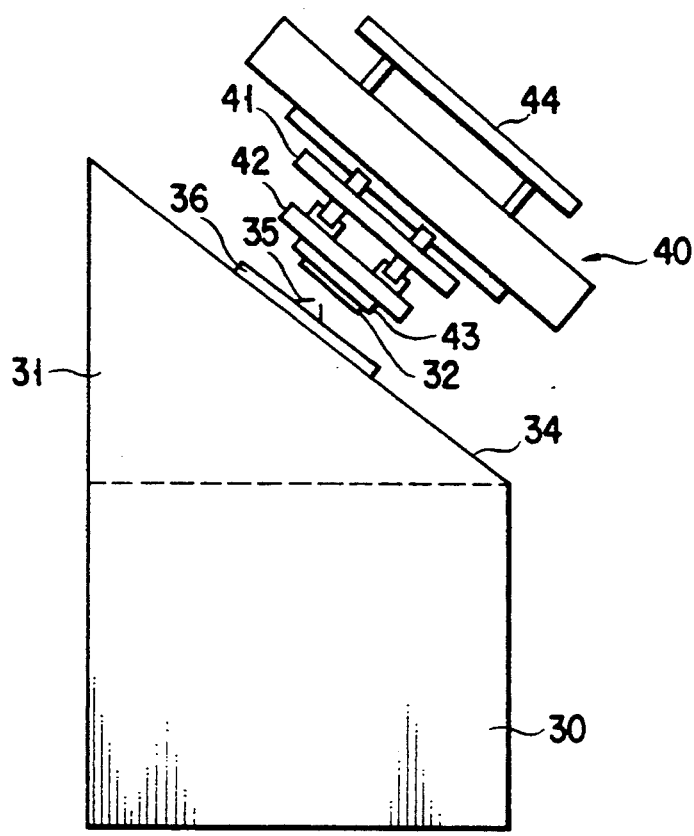
F I G. 3
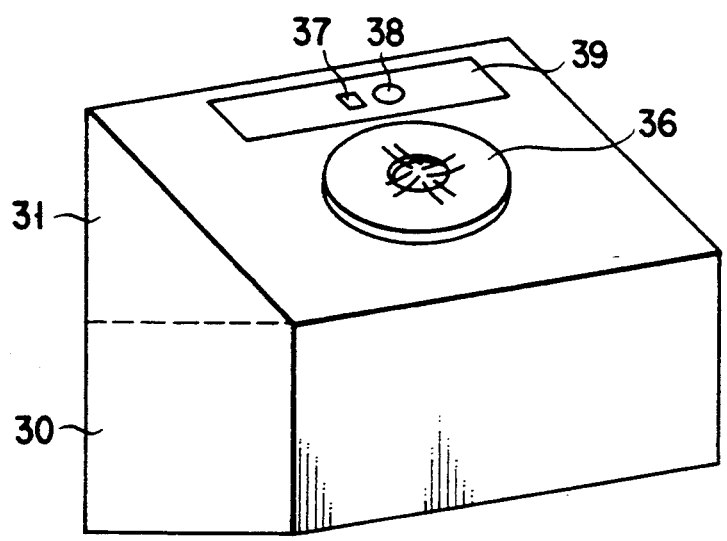
F I G. 4

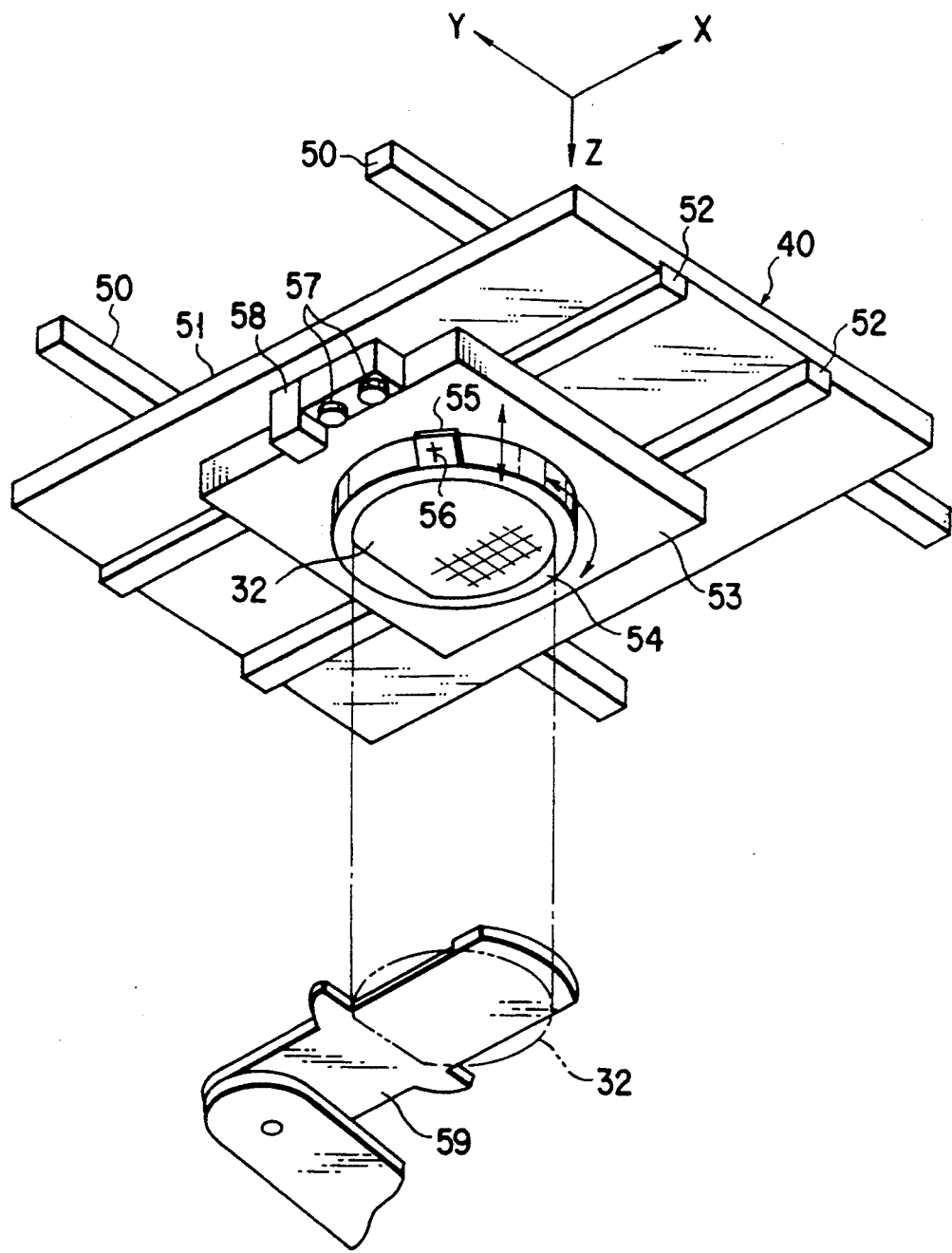
F I G. 5

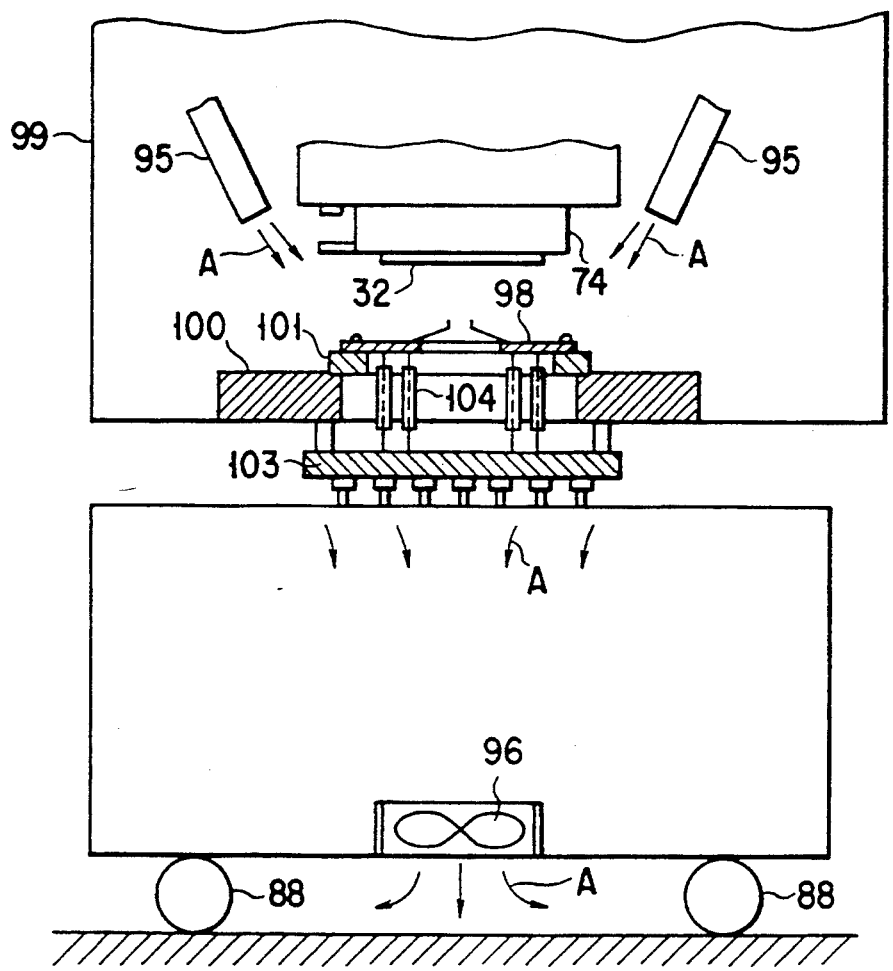
F I G. 12

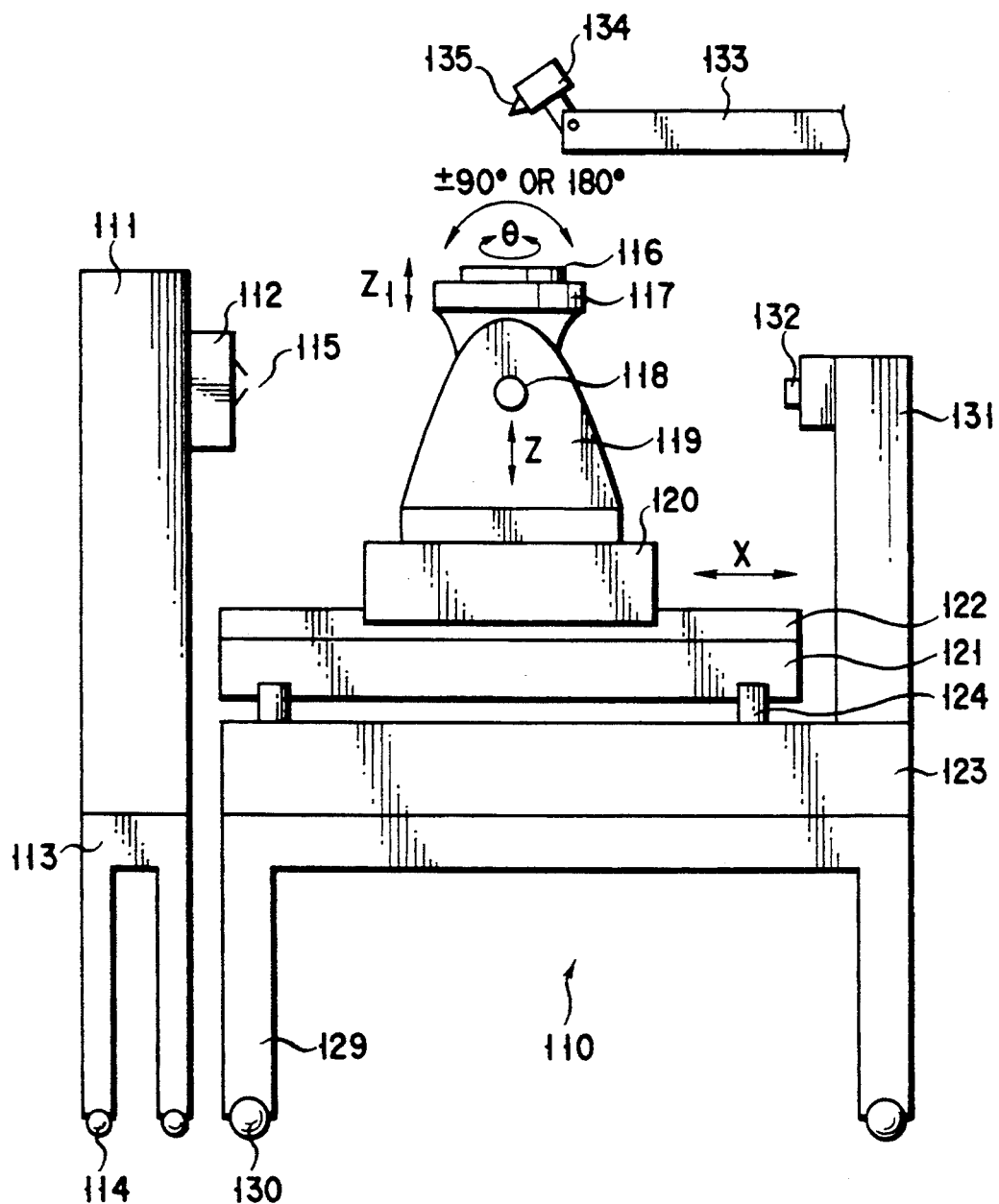
F I G. 13

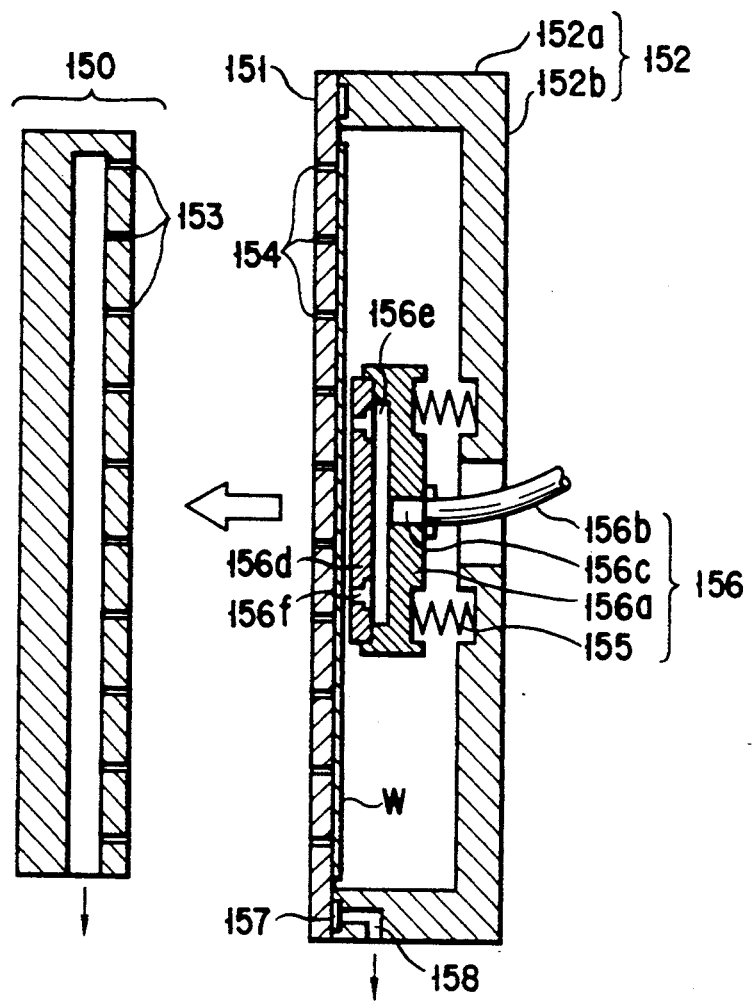
F I G. 17

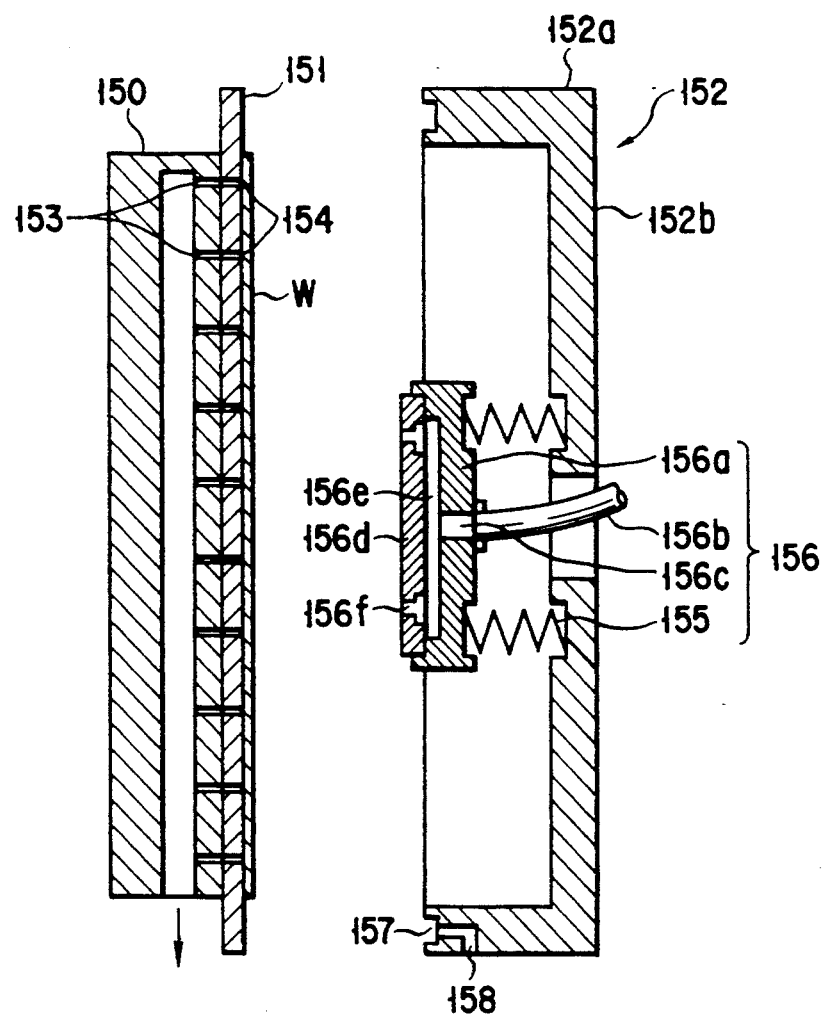
F I G. 20

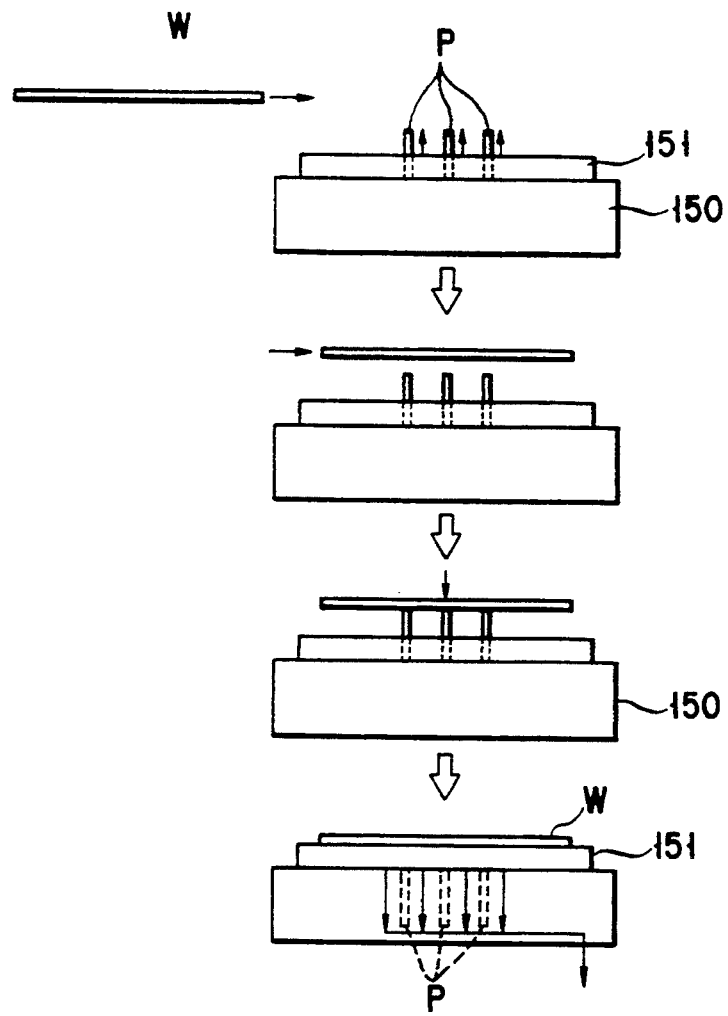
F I G. 28 ered more rigid to make stronger the hinge system by which the test head 15 is swung. Therefore, the probe apparatus becomes larger-sized. Further, there is a fear that wirings in the cable are broken because the diameter of the cable becomes larger and because a more excessive load is thus added to the cable when the test head 15 is to be swung.

In the case of the above-arranged probe apparatus, too, it cannot be avoided that the cable through which the test head 15 is connected to the external measuring equipment becomes longer. When electric characteristics of objects such as semiconductor wafers are to be examined, it is usually preferable that the examination is carried out using a frequency substantially the same as or near to that of signals applied from the objects to be examined. When the cable is long, however, a signal delay of about 1 nsec is caused per 10 cm of the cable. Therefore, the examination cannot be carried out at a high frequency of about 500 MHz. The above-arranged probe apparatus was not satisfactory in this point when it was used to examine such semiconductor chips that must meet high speed for super computers.

Another tester comprising a tester body 2 provided with the measuring equipment and a test head 20 combined with the tester body 2, as shown in FIG. 2, is well-known. In the case of this tester, the cable through which the test head 20 is connected to the measuring equipment is shorter, as compared with the above-mentioned one. This can prevent signal delay from being caused.

However, this tester takes a longer time for measurement because the measuring person must examine a semiconductor chip 22 after it is manually picked up from its packaged cassette and must manually return it to the cassette after the examination is finished. This makes it impossible to examine a large number of matters with high efficiency.

SUMMARY OF THE INVENTION

The object of the present invention is therefore to provide a probe apparatus capable of examining electric characteristics of matters without swinging the heavy test head.

This object can be achieved by a probe apparatus comprising a probe card having a plurality of probes, an object holder member arranged above the probe card to hold object to be examined, and a tester head electrically connected to probes of the probe card.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view schematically showing the probe apparatus according to a first embodiment of the present invention;

FIG. 4 is a view schematically showing a tester according to the present invention;

FIG. 5 is a perspective view showing an object holder member by which an object to be examined is held;

FIG. 12 is a view showing in more detail a part of the probe apparatus shown in FIG. 11;

FIG. 13 is a side view illustrating a probe apparatus according to a third embodiment of the present invention;

FIG. 17 is a sectional view schematically showing a substrate transfer device designed for use in a probe apparatus of the present invention;

FIG. 20 is a sectional view schematically showing the substrate transfer device, and explaining how the device transfers a substrate to the wafer chuck of the probe apparatus;

FIG. 28 is a diagram for explaining how a wafer is mounted onto the transfer table of the probe apparatus shown in FIG. 27.

DETAILED DESCRIPTION OF THE PREFERRED EMBODIMENTS

Figure 1:
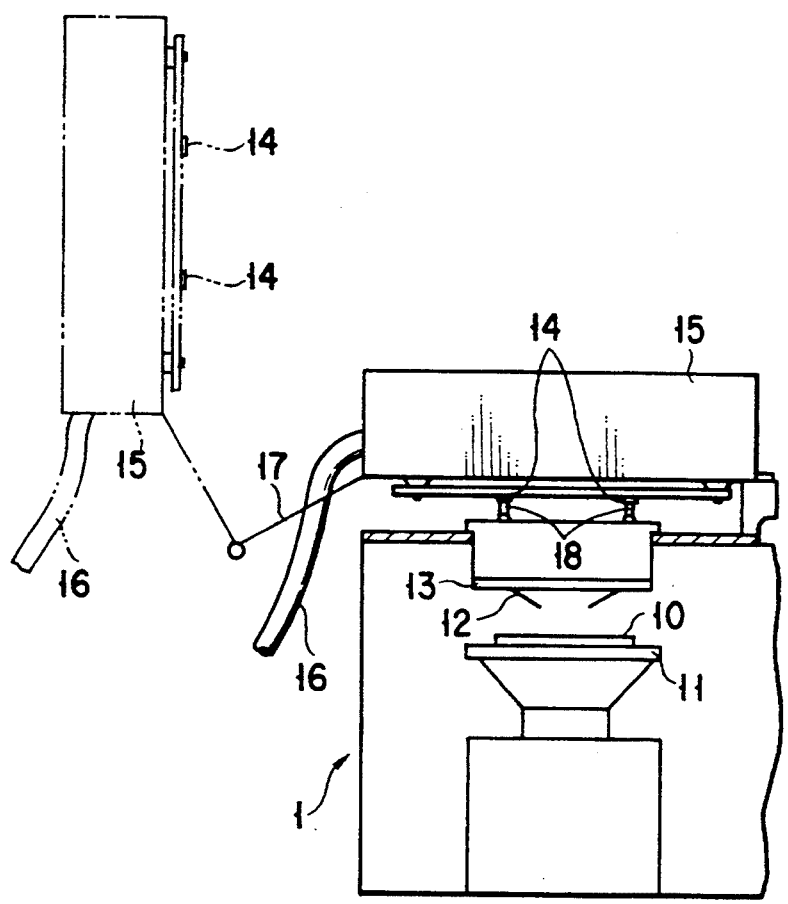
FIG. 1 is a view schematically showing the conventional probe apparatus.
Figure 2:
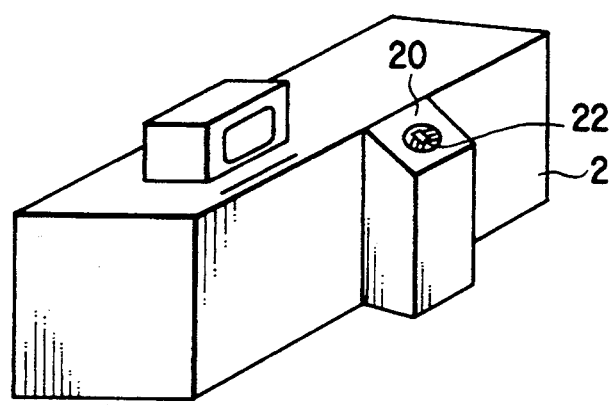
FIG. 2 is a view schematically showing the conventional tester.

FIG. 3 schematically shows the probe apparatus according to a first embodiment of the present invention. Reference numeral 30 in FIG. 3 represents a tester. A test head 31 is attached integral to the tester 30. A performance system including a power source for applying power to a semiconductor wafer 32, an electric equipment for sending output information applied from electrode pads of chips on the semiconductor wafer 32, which is to be probed, to the measuring equipment, a relay for changing over electric connection between a probe 35 and a test head body, an accuracy-adjusting capacitor, and others are housed in the test head 31. A measuring face 34 of the test head 31 is tilted by a certain angle of 45°, for example, relative to the horizontal plane. A probe card 36 having probes 35 is positioned on the measuring face 34 substantially at the center thereof. Probes 35 having a number equal to that of electrode pads of the semiconductor wafer 32, that is, several hundreds probes 35 are attached to the probe card 36 so as to exchange electric signals between the semiconductor wafer 32 and the test head 31.

As shown in FIG. 4, an alignment device 39 including a TV camera 37 for detecting positions of chips on the semiconductor wafer 32, and a capacitance sensor 38 for detecting the position of the semiconductor wafer 32 in an axis direction Z is arranged on the measuring face 34 of the test head 31.

On the other hand, an object holder member 40 attached to drive means (not shown) is arranged above the test head 31. A Y-stage 41 is mounted on the object holder member 40 and an X-stage 42 is then mounted on the Y-stage 41. Further, a wafer chuck 43 is mounted on the X-stage 42, chucking the semiconductor wafer 32 thereon. The object holder member 40 is tilted relative to the horizontal plane by a certain angle so as to correspond to the tilted measuring face 34 of the test head 31. Further, an angle adjusting system 44 is attached to the object holder member 40, thereby enabling the object holder member 40 to correspond to any of the measuring faces which are variously tilted relative to the horizontal plane.

As shown in FIG. 5, the object holder member 40 comprises a Y-state 51 freely slidable on guide rails 50 which extend in a direction Y, an X-state 53 freely slidable on guide rails 52 which extend on the Y-stage 51 in a direction X, and a chuck 54 movable up and down (or in a direction Z) and rotatable in relation to the X-stage 53. The chuck 54 includes sucking means (not shown) to suck and hold the semiconductor wafer 32 thereon.

A reference position member 55 is projected from the side of the chuck 54. This reference position member 55 is a piece of glass used as a transparent electrode for the liquid crystal and provided with a cross reference mark 56 made of Cr at the center thereof. Position detector cameras 57 are attached to one side of the X-stage 53 to detect positions of the probes 35 of the probe card 36 in the directions X and Y and also to detect the position of the reference mark 56 of the reference position member 55 in the direction Z. These position detector cameras 57 can be switched from high to low magnification and vice versa. A drive means 58 is arranged on one side of the position detector cameras 57 to drive them in the direction Z. The object holder member 40 can be moved as a whole in the horizontal direction by a drive system (not shown). In the case of the above-arranged object holder member 40, the semiconductor wafer 32 is picked up from a cassette (not shown) and carried under the chuck 54 by a carrying arm 59 and then sucked by the chuck 54. The semiconductor wafer 32 is thus held by the object holder member 40.

when a semiconductor chip and probes are to be positioned to one another, probe traces of the semiconductor chip are detected by the TV camera 37 shown in FIG. 4 to confirm the position of the semiconductor chip. Positional information of this semiconductor chip is compared with that of the probes detected from the side of the semiconductor wafer by the position detector cameras 57, and then arithmetically calculated by a control means (not shown) so as to allow the probes to be contacted with electrode pads of the semiconductor chip. The position of the reference mark 56 of the reference position member 55 in the direction Z detected by the capacitance sensor 38 is also similarly compared with that of the reference mark 56 in the direction Z detected by the position detector cameras 57, and then arithmetically calculated by the control means so as to correct the positional shift of the semiconductor wafer which is caused by expansion of members and other causes.

Figure 6:
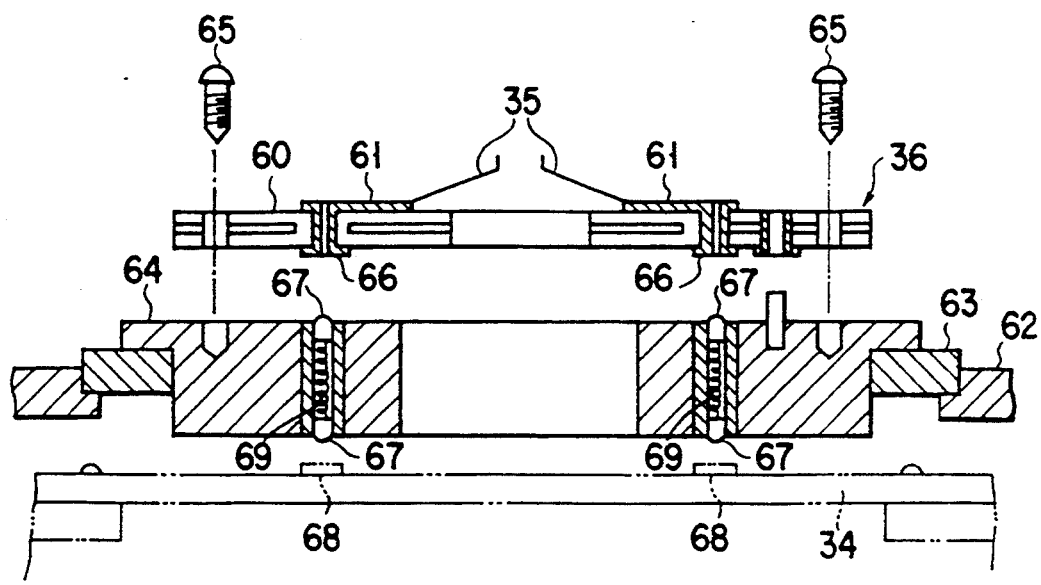
FIG. 6 is a view schematically showing attachments for a probe card.

The fixing of the probe card 36 to the test head 31 is carried out as follows. As shown in FIG. 6, a plurality of probes 35 are attached to the body of the probe card 36 so as to connect with a conductive section 61 formed on a printed circuit board 60. A head plate 62 is attached to the measuring face 34 of the test head 31 and a holder member 64 is attached to the head plate 62 through an insert ring 63. The body of the probe card 36 is then attached to the holder member 64 by fixing screws 65. The probe card 36 is thus fixed to the test head 31. When the probe card 36 is fixed to the test head 31 in this manner, around potential supply pads 66 connected to the conductive section 61 of the probe card 36 are electrically connected to one end of each of input/output pins 67. These input/output pins 67 are electrically connected to contact elements 68 of the test head 31 at the other ends thereof, passing through holes in the holder member 64. A compression spring 69 is housed in each of the input/output pins 67 to establish reliable connection between the around potential supply pads 66 and the contact elements 68. Electric signals can be thus exchanged between the probes 35 of the probe card 36 and the test head 31.

It will be now described how the above-arranged probe apparatus is operated.

Figure 7:
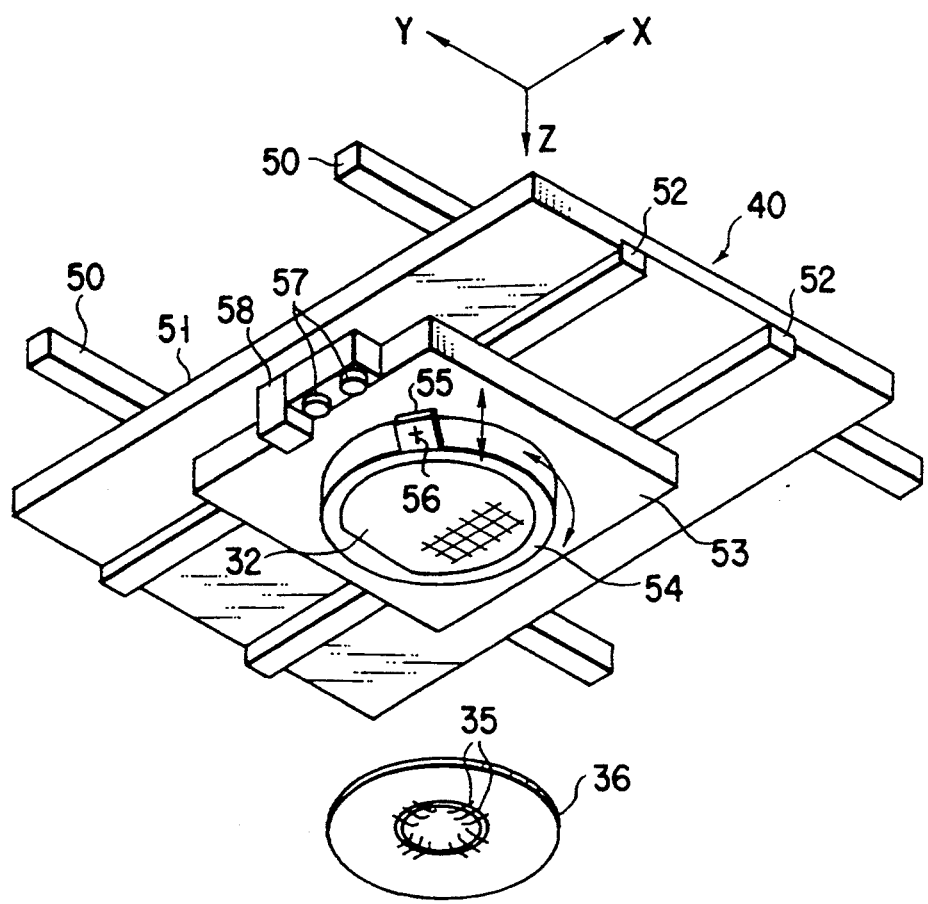
FIG. 7 is a view schematically showing the relation of the object to be probed to the probe card.

The semiconductor wafer 32 which is a matter to be examined is sucked and held by the chuck 54 of the object holder member 40, as shown in FIG. 7. The chuck 54 is then moved to oppose to the alignment device 39 and the position of a chip of the semiconductor wafer 32 is detected by the TV camera 37 of the alignment device 39 on the test head 31. This image information thus detected is stored and compared with those of patterns of the second and following semiconductor wafers to position them. The semiconductor wafer 32 thus positioned by the alignment device 39 is opposed, while being held by the chuck 54, to the probe card 36 with a clearance interposed between them.

The chuck 54 is then moved in the directions X, Y and Z responsive to the positional information of the probes 35 previously confirmed by the position detector cameras 57 of the object holder member 40. The positioning of the probes 35 of the probe card 36 relative to their corresponding electrode pads of the chip of the semiconductor wafer 32 is thus finished and electric characteristics of the semiconductor wafer can be therefore measured while contacting the probes 35 with their corresponding electrode pads.

Measuring electric signals are transmitted in this case among the tester 30, the test head 31, the probe card 36, the probes 35 and the chips of the semiconductor wafer 32. According to the present invention, the test head 31 is attached directly to the tester 30. The cable connecting the both with each other can be made shorter, accordingly. This can prevent electric signals from being delayed. As the result, the characteristics examination can be carried out at a higher frequency. In addition, the cable is not exposed outside, thereby preventing it from being damaged.

After the characteristics examination relating to one chip of the semiconductor wafer 32 is finished in this manner, the semiconductor wafer 32 is moved using the X- and Y-stages 51 and 53 and electrode pads of a next chip on the semiconductor wafer 32 are positioned relative to their corresponding probes. The characteristics examination of the chip on the semiconductor wafer 32 is then conducted and this process is successively repeated relating to remaining chips on the semiconductor wafer 32. When the characteristics examination relating to one semiconductor wafer is finished in this manner, the object holder member 40 is moved or slid in the traverse direction, for example, and the semiconductor wafer which has been examined is exchanged with a new one. The same characteristics examination as described above will be conducted relating to this new semiconductor wafer.

According to the probe apparatus of the present invention, the test head 31 is made integral to the tester 30 and its measuring face 34 is tilted relative to the horizontal plane. This makes it unnecessary to use the hinge system, which was needed for the conventional probe apparatuses, thereby making the probe apparatus of the present invention miniaturized.

Another example of the probe apparatus according to the present invention will be described.

Figure 8:
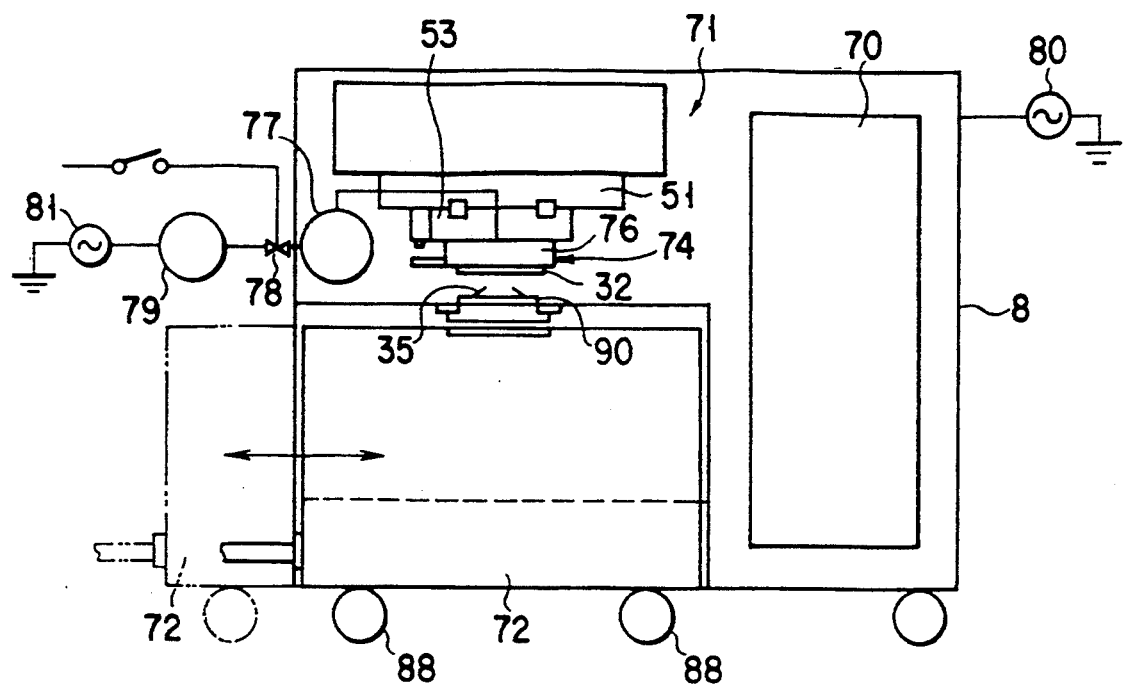
FIGS. 8 through 11 are views schematically showing a probe apparatus according to a second embodiment of the present invention, in which FIG. 9 schematically shows loader and probe sections of the probe apparatus shown in FIG. 8, and FIG. 10 schematically shows an example of the suction means of the probe apparatus shown in FIG. 8.
Figure 9:
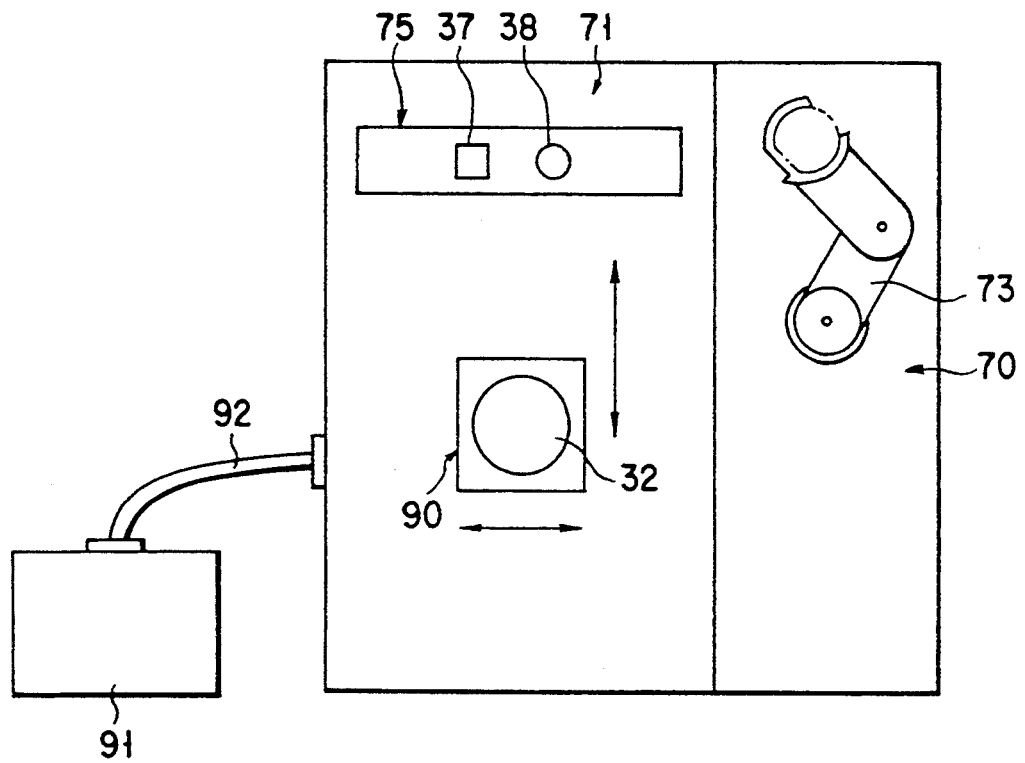

As shown in FIG. 8, this another probe apparatus comprises a loader section 70 for carrying semiconductor wafers, which are objects to be examined, into and out of the apparatus, a probing section 71 located by the loader section 70, and a test head 72 movable into and out of a space under the probing section 71. A carrying arm 73 is attached to the loader section 70, as shown in FIG. 9. This carrying arm 73 is a multi-jointed link system rotatable on the horizontal plane and movable in the vertical direction. It can therefore carry the semiconductor wafer between the cassette (not shown), in which a plurality of semiconductor wafers are housed, and the probing section 71.

Figure 10:
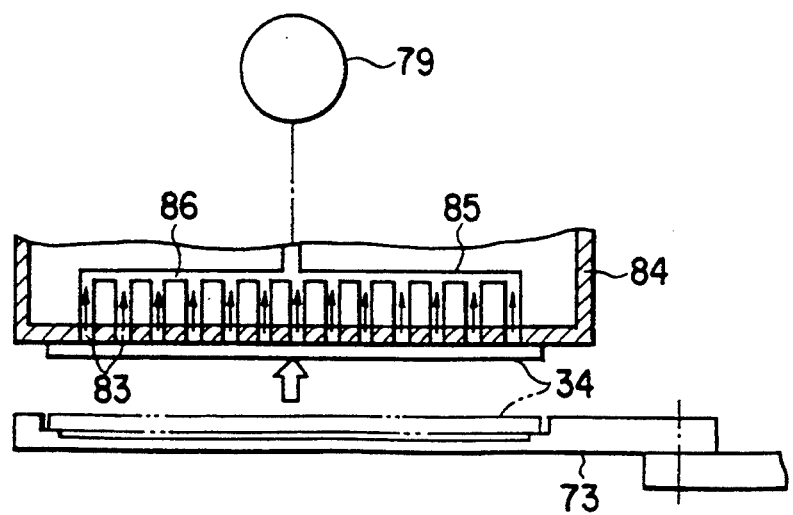

The probing section 71 includes an object holder member 74 for holding an object to be examined, an alignment device 75, and a probe card 90, as shown in FIG. 9. The object holder member 74, the alignment device 75 and the probe card 90 are arranged in the same manner as described above. A vacuum pump 79 is connected to a chuck 76 of the object holder member 74 via a tank 77 and an electromagnetic valve 78, as shown in FIG. 8 (interlock system). The vacuum pump 79 is also connected to a power source 81 different from a main power source 80 used for the probe apparatus 8. When the power source 8i is used in this manner, the dropping of the semiconductor wafer, which is attracted to and held by the chuck 76, can be prevented even if the main power source 80 is switched off. The electromagnetic valve 78 is connected to an emergency power source 82 and even when the main power source 80 and the power source 81 are stopped by a power stoppage, for example, therefore, the semiconductor wafer sucked and held by the chuck 76 can be prevented from dropping. In short, the electromagnetic valve 78 is closed at the time of the power stoppage to keep the tank 77 vacuum and the semiconductor wafer can be sucked and held by the chuck 76 through the tank 77 thus kept vacuum. The electromagnetic valve 78 is opened at the usual time and the semiconductor wafer is sucked and held by the chuck 76 through the vacuum pump 79. The chuck 76 comprises a chuck body 84 having a plurality of holes 83 in the underside thereof, and flexible pipe passages 86 arranged in a hollow portion 85 in the chuck body 84, as shown in FIG. 10. When the semiconductor wafer 32 is to be attracted to and held by the chuck 76, therefore, it is carried under the chuck 76 by the carrying arm 73 and that face of it which is opposed to its probed face as then contacted with the underside of the chuck body 84. The vacuum pump 79 is then made operative to make the hollow portion 85 of the chuck body 84 pressure-reduced. The semiconductor wafer 32 can be thus attracted to and held by the chuck 76.

The test head 72 is shaped like a box, as shown in FIG. 8. It includes a probing power source for applying voltage to the semiconductor wafer, an electric equipment for causing input and output to be transmitted between the measuring equipment and electrode pads, and others. A connecting section 87 is formed on the top of the test head 72 and it can be contacted with an input/output section of a probe card 90. It is preferable that a height adjusting system (not shown) is attached to the test head 72 to reliably contact the connecting section 87 with the input/output section of the probe card 90.

Further, casters 88 are attached to the underside of the test head 72, so that the test head 72 can be easily moved. The test head 72 may run on guide rails, for example. The test head 72 is connected to tester 91, which is located outside the probe apparatus, through a cable 92.

In the case of the above-arranged probe apparatus, too, electric characteristics of the semiconductor wafer can be examined in the same manner as described above. The second probe apparatus is set upside down in this case, as compared with the conventional one. In short, the semiconductor wafer which is an object to be examined is positioned just above the probe card. The chuck 76, however, has the above-described sucking system. The semiconductor wafer can be thus reliably prevented from dropping off the chuck 76 and electric characteristics of the semiconductor wafer can be excellently examined even in this case.

Figure 11:
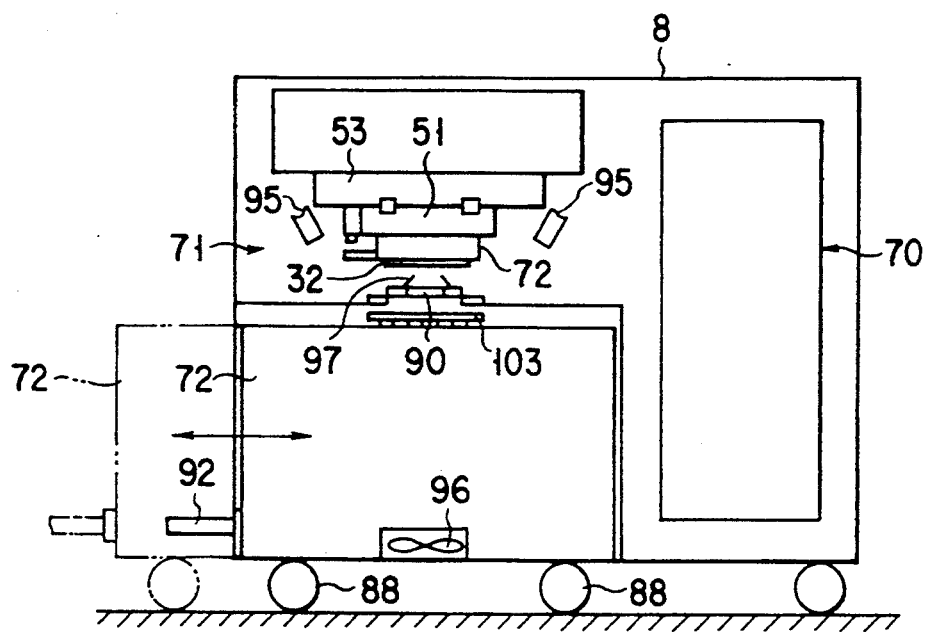

As shown in FIG. 11, it may be arranged in the second probe apparatus that gas supply nozzles 95 are arranged on both sides of the probing section 71 and that a fan 96 is arranged on the bottom of the test head 72. When arranged in this manner, oxide film pieces cut off from electrode pad surfaces by probes 97 and fine particles entering from outside into the probe apparatus at the probing time can be eliminated.

The test head which is opposed to the probe card provided with a plurality of probes has a large heat value. Therefore, there is a fear that the probe card above the test head is heated by the convection of heat. When down flow is created by clean air and $N_2$ gas of low temperature, however, it can be prevented that temperatures of the semiconductor wafer and the probe card are raised. Cooled gas is introduced (in directions A), in this case, through the supply nozzles 95 at the examining time. The gas thus introduced flows from the probing section of the probe apparatus into the test head and it is then exhausted outside from the bottom of the test head by the fan 96.

The attaching manner of the probe card may be as shown in FIG. 12. More specifically, a probe card 98 is attached to the top of a plate 100 on a body of the probe apparatus through an insert ring 101 and is then connected to a performance board 103 on the top of a test head 102 through coaxial cables 104. In short, the test head is designed to have the function of the performance board in it. However, this performance board function may be incorporated into the probe card. Namely, the probe card may also have the function of the performance board in which a relay for switching the electric connection of probes relative to the test head, an accuracy adjusting capacitor and others are included. When so arranged, the whole length of cables can be made shorter by that length of wirings which are needed for the performance board, and the delay of electric signals can be reduced so much. This enables the measurement of electric characteristics to be achieved at a far higher frequency.

Another type of probe apparatus according to the present invention will be described. The third embodiment is characterized in the following respects.

The probe apparatus according to the third embodiment has a table for supporting an object to be examined, a scanning means, and a number of probes. The table is orientated in a first direction. Prior to electric probing of the object, the object is placed on the table, and the scanning means performs two-dimensional scanning on the object, thereby acquiring data which represents the position of the probed portion of the object. Then, the table is oriented in a second direction. The probes are put set in contact with the probed portion of the object supported on the table. This done, electric probing is conducted on the object. More specifically, the scanning means scans the object, thus examining the entire probed portion of the object.

The third embodiment will be described in greater detail, with reference to FIG. 13 and FIG. 14 which are a side view and a perspective view, respectively. As can be understood from these figures, a probe card is arranged with its surface extending vertically.

Figure 14:
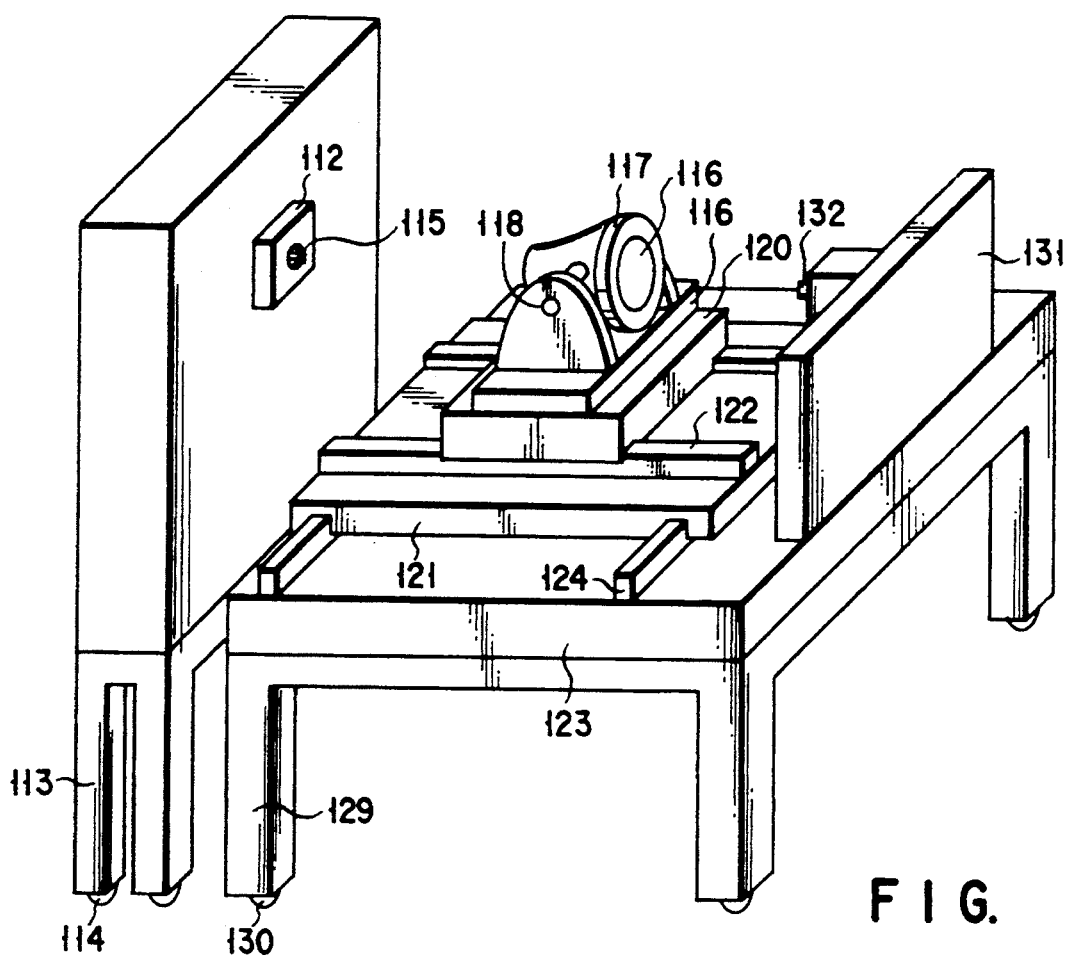
FIG. 14 is a perspective view of the probe apparatus shown in FIG. 13.

As shown in FIGS. 13 and 14, a test head 111 is located at one side of the body 110 of the probe apparatus and mounted on a transfer table 113. The test head 111 extends vertically. A probe unit 112 is secured to one side of the test head 111, having its surface extending vertically since the test head 111 extends in the vertical direction. The test head 111 can be moved in the horizontal direction because the table 113 can move in that direction. Rollers 114 are attached to the lower end of the transfer table 113, enabling the table 113 to move easily on the floor. The test head 111, which is mounted on the table 113, can move horizontally with ease and in safety even if the test head 111 is large enough to test high-speed ICs such as a microprocessor and a DSP. Hence, it is easy to replace the probe unit 112 with a new one, and to achieve maintenance of the test head 111. Extending vertically, the test head 111 does not bother an operator examining the stylus marks made on the object through a microscope. Thus, the probe apparatus excels in operability, too.

The probe unit 112 can be removed from the test unit 111. The probe unit 112 contains a probe card which has a number of probes 115. To examine the object, e.g., a semiconductor wafer 116, the test head 111 is moved horizontally until the probes 115 of the unit 112 contact the bonding pads of the IC chips which are located on the probed portion of the semiconductor wafer 116. Then, the IC chips on the wafer 116 can be electrically examined.

The wafer 116 is attracted to and held by a wafer chuck 117 which is a vacuum chuck of the same type as the chuck 76 shown in FIG. 10. A vacuum chuck is suitable for holding a wafer which is to be at low temperatures. Nonetheless, the wafer 116 may be held by means of an electrostatic chuck. The wafer chuck 117 is mounted on a support shaft 118. It can be rotated around the shaft 118 by a drive mechanism (not shown), taking three alternative positions. When the chuck 117 assumes the first position, the wafer 116 is held with its surface extending horizontally. When the chuck 117 is rotated clockwise by about 90° from the first position and takes the second position, the wafer 116 will have its surface extending vertically. When the chuck 117 is rotated counterclockwise by about 90° from the first position and assumes the third position, the wafer 116 will also have its surface extending vertically.

As shown in FIG. 13, the support shaft 118 is secured to a table 119. The table 119 is fastened to an X-stage 120 and can be moved in an X direction and can also be moved up and down in a direction Z by a lift mechanism (not shown). The X-stage 120 is mounted on rails 122 which are laid on a Y-stage 121 and which extend in the direction X. The X-stage 120 can therefore be moved in the direction X by a drive mechanism. The Y-stage 121 is mounted on rails 124 which are laid on a base 123 and which extend in a direction Y. The Y-stage 121 can therefore be moved in the direction Y by the drive mechanism.

Figure 15:
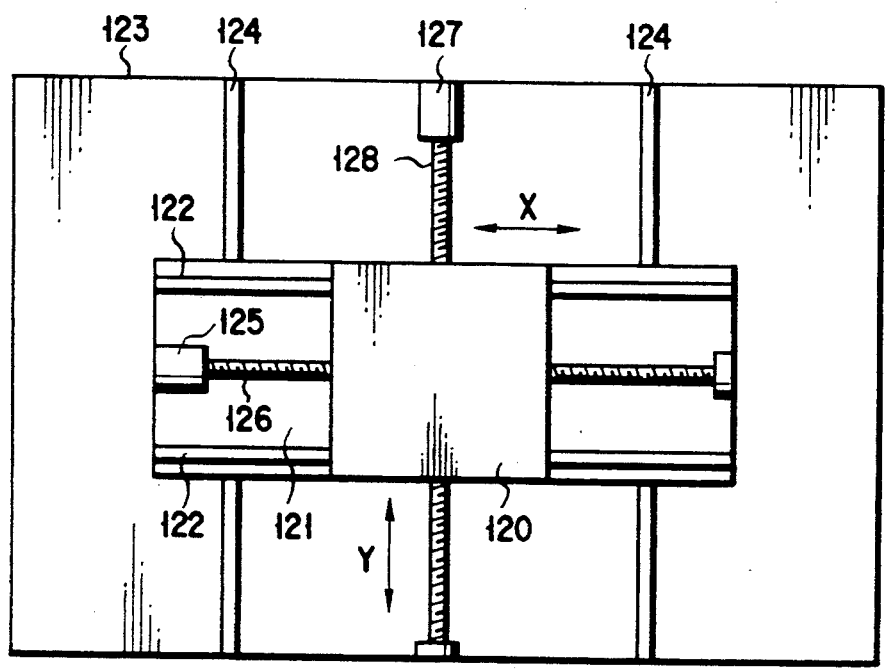
FIG. 15 is a plan view of an mechanism incorporated in the probe apparatus of FIG. 13, for moving a object to be examined.

The drive mechanism for moving the X-stage 120 and the Y-stage 121 will be described with reference to FIG. 15.

An electric motor 125 is mounted on the Y-stage 121. A ball screw 126 is coupled to the shaft of the motor 125 and set in screw engagement with a nut (not shown) fixed to the X-stage 120. Hence, when the motor 125 is driven, the X-stage 120 is moved in the direction X, guided by the rails 122 laid on the Y-stage 121, whereby the wafer chuck 117 is moved in the direction X, moving the wafer chuck 117 in the direction X.

The Y-stage 121 is moved in the direction Y by the same method as the X-stage 120 is moved in the direction X. To be more explicit, The shaft of an electric motor 127 is connected to a ball screw 128. The ball screw 128 is set in screw engagement with a nut (not shown) fixed to the Y-stage 121. Hence, when the motor 127 is driven, the Y-stage 121 is moved in the direction Y, guided by the rails 124 laid on the base 123, whereby the wafer chuck 117 is moved in the direction Y, moving the X-stage 120 and the wafer chuck 117 in the direction Y.

The base 123 is arranged on a transfer table 129. Rollers 130 are attached to the lower end of the transfer table 129, enabling the table 129 to move smoothly on the floor. An alignment unit 131 is secured to the transfer table 129, extending upwards from the upper surface of the table 129. Two imaging devices, e.g., two CCD cameras 132, are attached to the upper end portion of the alignment unit 131, one having a high magnification and the other having a low magnification. These cameras 132 are used for achieving fine alignment of the wafer 116 and inspecting any defective IC chip found on the wafer 116.

A marking device 133 is located above the wafer chuck 117. An inking marker 134 is attached to the distal end of the device 133, for marking defective IC chips, if any are found on the semiconductor wafer 116. More precisely, an ink needle 135 protruding from the inking marker 134 can put an mark on any defective IC chip found through examination.

It will be explained how the probe apparatus of FIGS. 13 and 14 examines a semiconductor wafer.

The wafer 116 is loaded into the probe apparatus and held on the wafer chuck 117. Next, the wafer 116 is pre-aligned, fine-aligned, and probed. Then, any defective IC chip found on the wafer 116 is marked and inspected. Finally, the wafer 116 is unloaded from the probe apparatus. These steps will be described in detail.

First, a transfer arm (not shown) transfers the wafer 116 from a wafer cassette (not shown) to a pre-alignment stage (not shown). At the pre-alignment stage the wafer 116 is pre-aligned with reference to the position of its orientation flat. Next, the transfer arm transfers the wafer 116 from the pre-alignment stage to the wafer chuck 117. The wafer chuck 117 has been rotated by the drive means (not shown) and now has its wafer-holding surface extending substantially parallel to a horizontal plane. The wafer chuck 117 therefore attracts and holds the semiconductor wafer 116 on its wafer-holding surface.

Next, the wafer 116 is subjected to fine alignment. The wafer 116 is first put to centering. Then, the wafer 116 is positioned to have its axis aligned with the Y axis of the probe apparatus. Further, it is determined whether or not the thickness of the wafer 116 is of a designed value. These steps of fine alignment will be described in detail.

The wafer chuck 116 is rotated clockwise by 90°, and the X-stage 120 is moved. The wafer 116 is thereby rotated and moved in the direction X. The low-magnification CCD camera 132 monitors the wafer 116 moving in the X direction. The X-stage 120 is stopped when the low-magnification CCD camera determines that the wafer 116 has reached a position where it can be inspected. Then, the Y-stage 121 is moved in the direction Y, and the table 119 is simultaneously moved in the direction Z by the lift mechanism (not shown). As a result, the wafer 116 is moved in a vertical plane. The low-magnification CCD camera monitors the wafer 116 moving in that vertical plane, and detects the position the wafer 116 assumes every moment.

Thereafter, the centering of the wafer 116 is performed, by using the low-magnification CCD camera. First, the lift mechanism moves the table 119 in the direction Z, thus moving the wafer 116 held on the wafer chuck 117 in the same direction. Coordinates are determined of the two points at which a scanning line of the low-magnification CCD camera intersects with the left and right edges of the wafer 116. Then, the Y-stage 121 is moved, moving the wafer 116 held on the wafer chuck 117 in the direction Y. Thereafter, coordinates are determined again of the other two points at which the same scanning line of the low-magnification CCD camera intersects with the left and right edges of the wafer 116. From the coordinates of the four points, thus determined, the coordinates $C_2$ of the wafer center are calculated. From the coordinates $C_2$ and the known coordinates $C_1$ of the wafer center, the displacement $C_1$–$C_2$ of the wafer center from the center of the chuck 117 is obtained. In accordance with this displacement the wafer chuck 117 is moved in the X and Y directions, and the wafer 116 is moved so, whereby the centering of the wafer 116 is accomplished.

Next, the wafer 116 is positioned to have its one axis aligned with the Y axis of the probe apparatus, by using the high-magnification CCD camera. To state more precisely, the high-magnification CCD camera detects the line connecting the bonding pads of one of the IC chips on the wafer 116, and the wafer chuck 117 is moved in the direction X until that line comes into alignment with the Y axis of the probe apparatus.

Finally, it is determined whether or not the thickness of the wafer 116 is of a designed value. More specifically, the thicknesses of the given portions of the wafer 116 are measured by an electrostatic sensor (not shown), and the mean value of the thicknesses measured is compared with the designed value.

After the fine alignment of the semiconductor wafer 116 has been completed, the wafer chuck 117 is rotated counterclockwise by 180°, and the X-stage 120 is moved, thereby placing the wafer 116 at a position where the probe unit 112 can examine the wafer 116. The probe unit 112 electrically examines the IC chips on the wafer 116, one after another. More precisely, the Y-stage 121 and the lift mechanism are driven, moving the wafer 116 in a virtual plane such that the probes 115 of the unit 112 contact the bonding pads of one IC chip at a time. The probes 115 of the probe unit 112 can be connected to and disconnected from the bonding pads of each IC chip by driving the X-stage 120, thus moving the wafer 116 in the direction X.

Although not shown, the probe apparatus has a fine drive mechanism for minutely moving the wafer chuck 117 in a direction $Z_1$ and a rotating mechanism for rotating the wafer chuck 117 in the direction of the arrow $\theta$. During the probing, the test head 111 extending vertically may be moved to the right in FIG. 13. Also in this case, the test head 111, which is considerably heavy, need not be rotated against its own weight. This would help to enhance the operability and safety of the probe apparatus. The rotation of the wafer chuck 117 may be controlled by feeding-back a position data obtained by the optical device such as a laser or a CCD camera to the driving device.

After completion of the probing, the wafer chuck 117 is rotated clockwise by 90°. The wafer 116 held on the chuck 117 is thereby positioned horizontally. Then, the X-stage 120 is moved until the inking marker 134 reaches a position right above the semiconductor wafer 116. The X-stage 120 and the Y-stage 121 are driven, moving the wafer 116 in a horizontal plane with respect to the inking marker 134. Further, the lift mechanism is driven, or the fine drive mechanism and the rotating mechanism are driven, thereby moving the ink needle 135 to and away from the semiconductor wafer 116. Thus, the inking marker 134 puts a mark to any IC chip that has been found to be defective.

After the marking has been completed, the wafer chuck 117 is rotated counterclockwise by 90° and the X-stage 120 is moved. Then the wafer 116 is inspected by means of the high-magnification CCD camera 132. Namely, the Y-stage 121 and the left mechanism are driven, moving the wafer 116 in a vertical plane with respect to the CCD camera 132. The CCD camera 132 determines whether or not the ink mark on, for example, a bonding pad of each defective IC chip is large or dense enough to be detected by a scanner (not shown). Thereafter, the wafer 116 is rotated counterclockwise by 180° and positioned to have its wafer-holding surface extending horizontally. Then, the transfer arm transfers the wafer 116 from the wafer chuck 117 back to the wafer cassette. Thus, the probe apparatus completes its operation.

Also with the probe apparatus shown in FIG. 13, it is possible to determine the electrical characteristics of the object, without moving the test head 111 which is a heavy component.

A probe apparatus, which is a fourth embodiment of the invention, will be described with reference to FIG. 16. This apparatus is characterized by a mechanism for rotating a wafer chuck 117.

Figure 16:
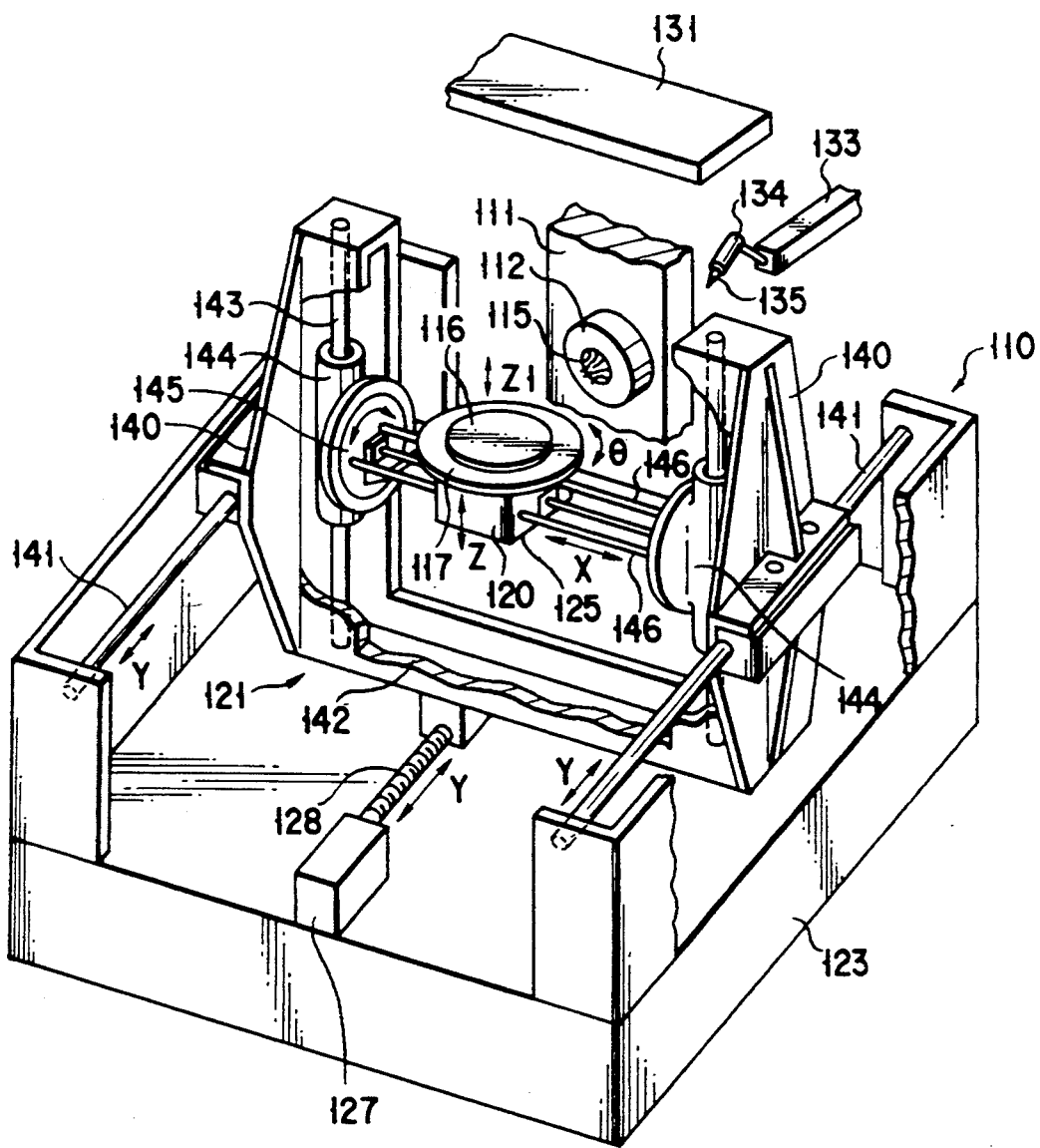
FIG. 16 is a perspective view showing a probe apparatus according to a fourth embodiment of the present invention.

As shown in FIG. 16, a Y-stage 121, which is substantially U-shaped, is supported to move in the direction Y above the base 123. To be more specific, two parallel guide rods 141 extend in the Y direction above the base 123, each secured at both ends to a frame connected to the base 123. A nut is fastened to the bottom of the Y-stage 121. A ball screw 128 is set in screw engagement with the nut, and coupled to the shaft of an electric motor 127 secured on the base 123. When the motor 127 is driven, the ball screw 128 in screw engagement with the nut is rotated, thereby moving the Y-stage in the direction Y along the guide rods 141.

Two parallel guide rods 143 extend from the bottom of the Y-stage 121, in the direction Z along the vertical arms 140. Two hollow cylindrical blocks 144 are slidably mounted on the guide rods 143, respectively. Two rotary stages 145 are coupled to the blocks 144, respectively, and are positioned in face-to-face relationship. The stages 145 can rotate around the X axis of the probe apparatus, for rotating the wafer chuck 117 through 90° in either direction. The rotary stages 145 are connected together by a ball screw 125 and two guide rods 146 which extend in the direction X and, hence, in parallel to one another. The hollow cylindrical blocks 144, to which the rotary states 145 are coupled, are connected together also by the ball screw 125 and the guide rods 146. One of the blocks 144 has a female screw and is set in screw engagement with the associated guide rod 143 which is a ball screw and which is connected to the shaft of en electric motor (not shown). Thus, when this motor is driven, the guide rod 143 is rotated, whereby both hollow cylindrical blocks 144 are moved in the direction Z.

An X-stage 120 is mounted on the guide rods 146 and is set in screw engagement with the ball screw 125. One end of the ball screw 125 is coupled to the shaft of an electric motor (not shown). Hence, when the ball screw 125 is rotated by the motor, the X-stage 120 is moved in the direction X along the guide rods 146. The wafer chuck 117 is mounted on and secured to the X-stage 120. The X-stage 120 incorporates a fine drive mechanism and a rotating mechanism (neither shown). The fine drive mechanism is used to minutely move the wafer chuck 117 in a direction $Z_1$. The rotating mechanism is used to rotate the wafer chuck 117 in the direction of the arrow $\theta$.

Above the Y-stage 121, an alignment unit 131 and a marking device 133 are juxtaposed. A test head 111 is located below the alignment unit 131 and beside the Y-stage 121. A probe unit 112 is mounted on one side of the test head 111. The test head 111 is so positioned that the surface of the probe unit 112 extends vertically.

The alignment unit 131 has a CCD camera which can monitor a wafer 116 mounted on the wafer chuck 117 and assuming a horizontal position. Hence, it is possible to align the wafer. An inking marker 134 is attached to the distal end of the marking device 133, for marking defective IC chips, if any are found, on the semiconductor wafer 116. To be more precise, an ink needle 135 protruding from the inking marker 134 can put a mark on any defective IC chip found through examination. The wafer 116 can be positioned in a vertical plane and can then be moved toward the probe unit 112 mounted on the test head 111. The wafer 116 is so moved until the probes 115 of the probe card contained in the probe unit 112 contact the bonding pads of the IC chips formed on the wafer 116. Thus, the IC chips can be tested for their electrical characteristics.

Figure 18:
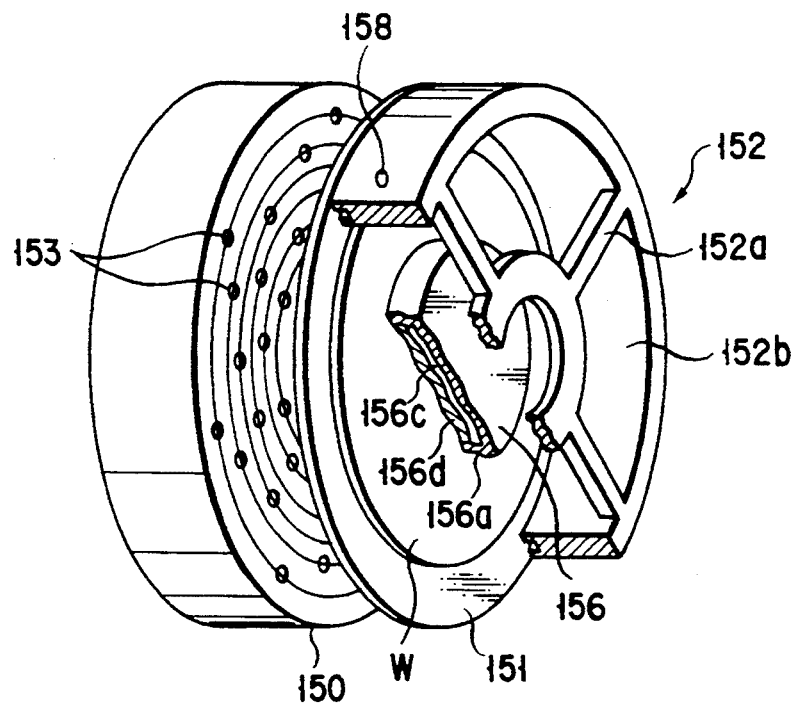
FIG. 18 is a perspective view of the substrate transfer device.

A substrate transfer device designed for use in the probe apparatus of the present invention will be described, with reference to FIGS. 17, 18, 19A, and 19B. FIGS. 17 and 18 are a respective sectional view and a perspective view, showing the transfer device. As shown in FIG. 17, the substrate transfer device comprises a support table 150, a wafer holder 151, and a transfer section 152. The transfer section 152 moves the wafer holder 151 toward and away from the support table 150, thereby transferring a wafer W held on the holder 151.

The support table 150 is included in the wafer chuck of the probe apparatus. It is positioned vertically. The table 150 is a hollow member, having a number of suction holes 153 in its wafer-holding surface. The table 150 is connected to a vacuum pump (not shown). When the vacuum pump is driven, negative pressure is generated in the table 150, whereby the wafer holder 151 holding a wafer W is attracted to the wafer-holding surface of the table 150.

The wafer holder 151 is a disc larger than the wafer W and has through holes 154. The wafer holder 151 can be pneumatically attracted to the wafer-holding surface of the table 150 as the negative pressure built in the support table 150 acts through the suction holes 153 and the through holes 154.

The transfer section 152 is designed to transfer the wafer holder 151 onto the support table 150. The section 152 comprises a ring-shaped member 152a, a disc-shaped frame 152b, four springs 155, and a gas-applying unit 156. The frame 152b is fastened to one end of the ring-shaped member 152a, and has a hole in its center portion. The springs 155 are fastened at one end to the inner surface of the frame 152b and arranged in a circle around the hole.

Figure 19A:
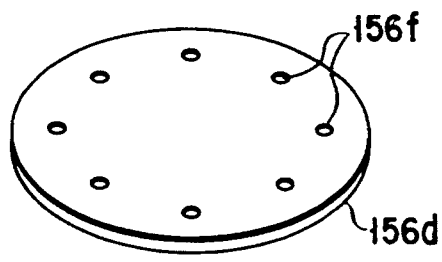
FIG. 19A is a perspective view of the gas-applying disc incorporated in the substrate transfer device.
Figure 19B:
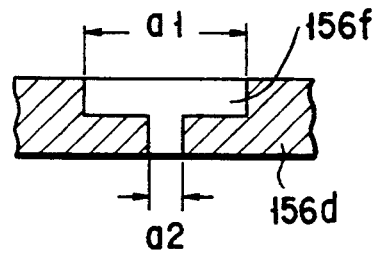
FIG. 19B is an enlarged sectional view showing a part of the gas-applying disk.

The gas-applying unit 156 is fastened to the other end of the springs 155. The gas-applying disc 165 comprises a hollow cylinder 156a, a gas-supplying tube 156b, and a gas-applying disc 165d. The cylinder 165a opens at one end and is fastened to the springs 155 at the other end. The other end of the cylinder 156a has a gas passage 156c in its center portion. The gas-supplying tube 156b is connected to the gas passage 156c of the cylinder 156a. The gas-applying disc 156d has a diameter of, for example, about 100 mm in the case where the substrate transfer device is designed to transfer 6-inch wafers. The disk 156d is connected to the cylinder 156a, covering the open end thereof. The cylinder 156a and the disk 156d define a gas chamber 156e. As shown in FIGS. 19A and 19B, the gas-applying disc 156d has eight gas-applying holes 156f located along the circumference of the disc 156d, spaced apart from each other equidistantly. The gas-applying holes 156f may be provided in numbers greater or less than 8. Each gas-applying hole 156f has a first diameter a1 of 3 mm at the inner surface of the disc 156d, and a second diameter a2 of 0.5 mm at the outer surface of the disc 156d. The diameters a1 and a2 may have other values.

The gas-applying unit 156 is used to apply gas, e.g., air, onto the wafer F placed on the wafer holder 151, thereby pressing the wafer W onto the wafer-holding surface of the holder 151 and thus holding the wafer W on the wafer holder 151. When the wafer holder 151 is not held by the transfer section 152, the gas-applying unit 156 assumes the position shown in FIG. 20, with the gas-applying disc 156d protruding from that end of the ring-shaped member 152a which faces away from the disc-shaped frame 152b. The force of the springs 155 and the speed of applying the gas are of such values that the unit 156 is positioned inside the disc-shaped frame 152b at a distance of about 60 to 160 μm from the wafer W when the wafer holder 151 is held by the transfer section 152 while the gas is being applied to the wafer W at pressure of, for example, 4 kgf/cm².

Guide pins (not shown) project from the hollow cylinder 156a, extend along the axes of the springs 155, and are slidably inserted in the holes (not shown) made in the ring-shaped member 152a. Hence, the gas-applying unit 156 can move exclusively in parallel to the axes of the springs 155, and is prevented from inclining to the wafer holder 151.

An annular groove 157 is formed in the lower-end face of the ring-shaped member 152a. The groove 157 communicates with a suction hole 158 made in the ring-shaped member 152a. The suction hole 158 is connected to the vacuum pump (not shown). When the vacuum pump is driven, drawing air from the annular groove 157 through the suction hole 158, the peripheral edge of the wafer holder 151 is attracted to the lower-end face of the ring-shaped member 152a.

How the substrate transfer device performs its function will now be described with reference to FIGS. 21A, 21B, and 21C.

First, the wafer holder 151 is placed on a table (not shown), and a wafer W is mounted on the wafer holder 151. The transfer section 152 is moved toward the wafer holder 151 until the lower-end face of the ring-shaped member 152a contacts the wafer-holding surface of the wafer holder 151. Then, the vacuum pump is driven, drawing air through the suction hole 158, thus attracting the wafer holder 151 to the ring-shaped member 152a. Simultaneously, air is applied at a pressure of 4 kgf/cm², through the gas-supplying tube 156b into the gas chamber 156e of the gas-applying unit 156, and is hence applied onto the wafer W through the gas-applying holes 156f. The gas-applying unit 156 is made to approach the wafer W, but does not contact the wafer W because of the air pressure in the gap between the wafer W and the gas-applying disc 156d. As a result, the wafer W is pressed and secured to the wafer-holding surface of the wafer holder 151. Thus, the wafer holder 151 pneumatically held by the transfer section 152 holds the wafer W.

Figure 21:
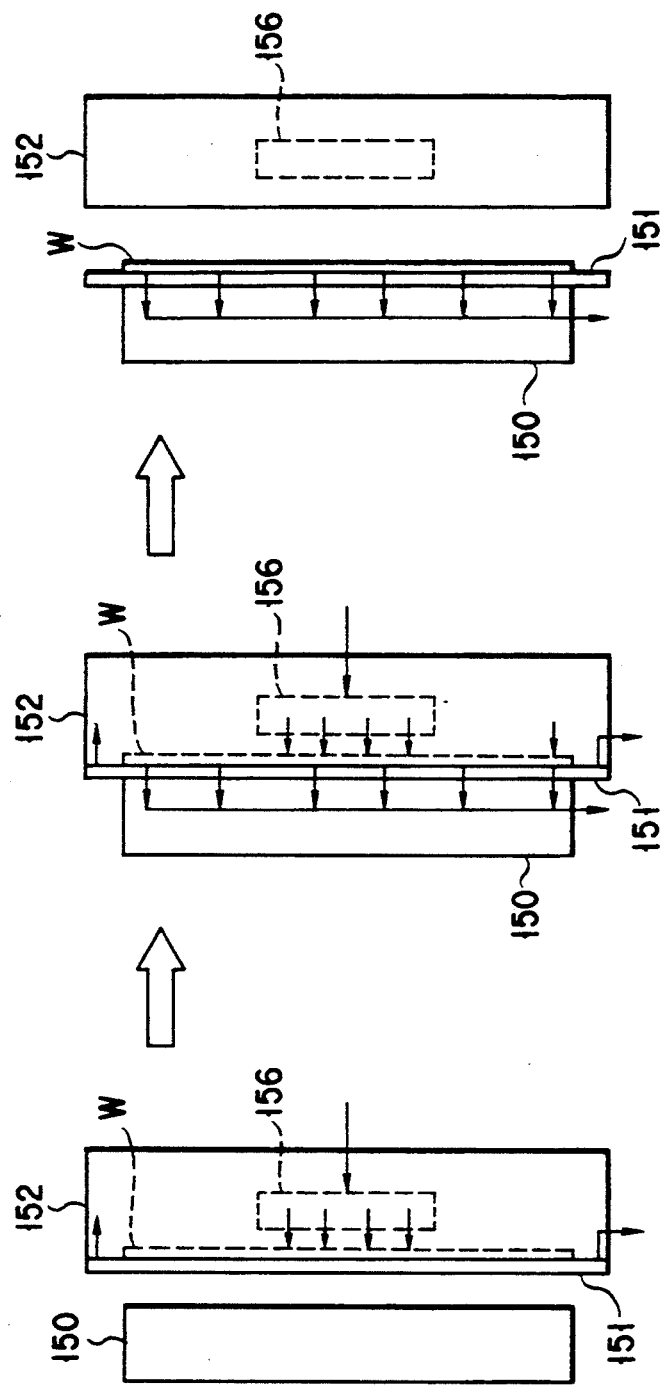
FIGS. 21A, 21B, and 21C are diagrams for explaining how the substrate transfer device transfers a semiconductor wafer.

Next, as shown in FIG. 21A, the transfer section 152 moves the wafer holder 151, now holding the wafer W, toward the support table 150. The holder 151 is moved until it contacts the support table 150. The vacuum pump (not shown) connected to the support table 150 is driven, drawing air from the hollow made in the table 110 as is shown in FIG. 21B. Negative pressure is thereby generated in the table 150, and the wafer holder 151 is attracted to the wafer-holding surface of the table 150. At the same time, the negative pressure is applied to the wafer W through the through holes 154 of the wafer holder 151, whereby the wafer W is attracted to the wafer holder 151 as is illustrated in FIG. 20.

Then, as shown in FIG. 21C, the vacuum pump connected to the suction hole 158 made in the ring-shaped member 152a of the transfer section 152 is stopped, whereby separating the transfer section 152 from the wafer holder 151.

Once placed on the wafer holder 151, the wafer holder 151 is attracted to the holder 151, and the wafer W is attracted to the wafer holder 151. Hence, even when the support table 150 is positioned vertically, the wafer W does not fall and can be transferred reliably. Further, since the wafer W remains on the wafer holder 151 while being transferred, it is not broken even if it is, for example, a Ga—As semiconductor wafer which is very fragile.

As long as the transfer section 152 holds the wafer holder 151, air is applied onto the wafer W through the gas-applying holes 156f of the gas-applying disc 156d. The disc 156d therefore remains spaced apart from the wafer W for a predetermined distance in spite of the force of the springs 155, no matter how thick or thin the wafer W is. (Semiconductor wafers which the probe apparatus is to examine have thicknesses ranging from 200 to 800 μm.) Since the distance between the wafer W and the gas-applying disc 156d remains unchanged, pressing the wafer W onto the wafer holder 151 with a constant air pressure.

Moreover, since air is drawn by the vacuum pump through the holes 154 of the wafer holder 151 and the suction holes 153 of the support table 150, the wafer W is reliably attracted to the wafer holder 151, and the wafer holder 151 is reliably secured to the support table 150.

The support table 150 need not always be positioned vertically. It can be turned to have its wafer-holding surface facing downwards or inclined to a horizontal plane.

Figure 22:
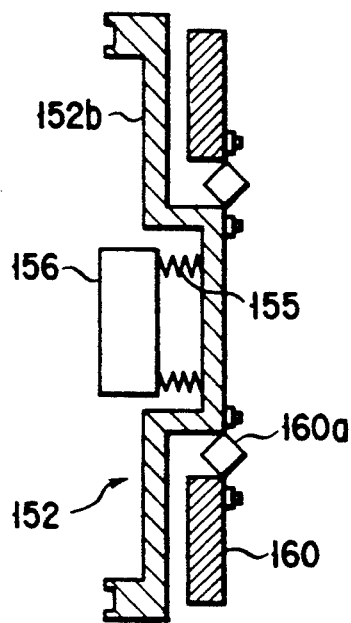
FIG. 22 is a sectional view illustrating an modification of the substrate transfer device.

FIG. 22 shows a modification of the substrate transfer device. The modified device is characterized in that two buffering members, e.g., leaf springs 160a, connect the ring-shaped member 152a of the transfer section 152 to the tips 160 of two transfer arms. The leaf springs 160a buffer the force which the wafer holder 151 exerts on the support table 150, enabling the ring-shaped member 152a to contact the wafer holder 151 as the transfer section 152 moves to the wafer holder 151. This helps to secure the wafer holder 151 to the ring-shaped member 152a with reliability. Since the lower surface of the wafer holder 151 can well contact the support table 150, the transfer section 152 can readily place the wafer holder 151 on the table 150.

Figure 23:
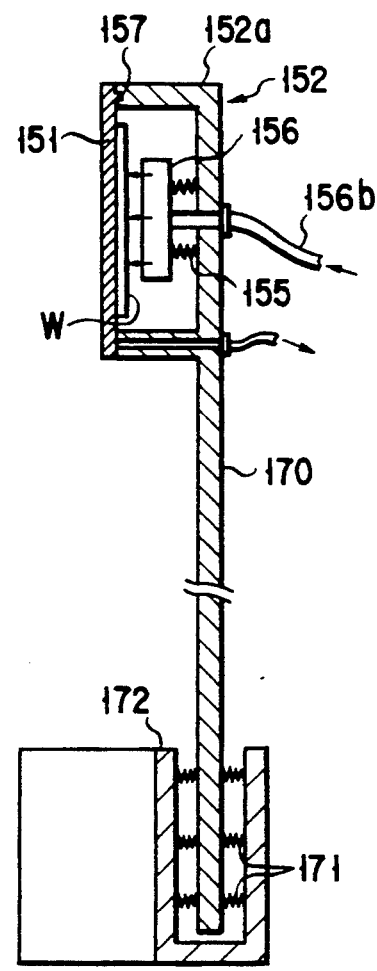
FIG. 23 is a sectional view showing another modification of the substrate transfer device.

FIG. 23 shows another modification of the substrate transfer device. This modified device is characterized in two respects. First, the transfer section 152 is coupled to the distal end of a transfer arm 170. Second, the proximal end of the transfer arm 170 is connected by a spring 171 to an arm drive section 172 which can move the arm 170 in the directions X, Y and Z and can rotate the arm 170 in the direction of arrow θ, or can move the arm 170 in the direction Z and rotate the arm 170 in the direction of arrow θ. This modified device achieves the same advantage as the modified substrate transfer device shown in FIG. 22.

Figure 24:
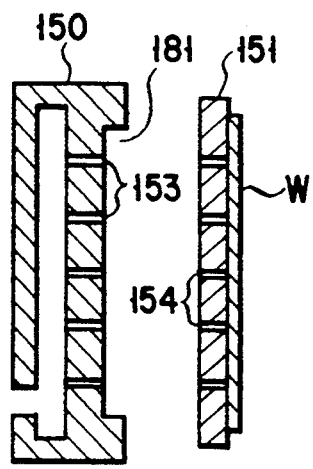
FIG. 24 is a sectional view showing a modification of the support table, which can be used in the substrate transfer device.

FIG. 24 illustrates a modification of the support table 150, which can be used in the substrate transfer device. This support table 150 has a circular recess 180 in the surface facing the wafer holder 151. The provision of the recess 180 makes it possible to attract the holder 151 to the support table 150 with reliability.

Figure 25:
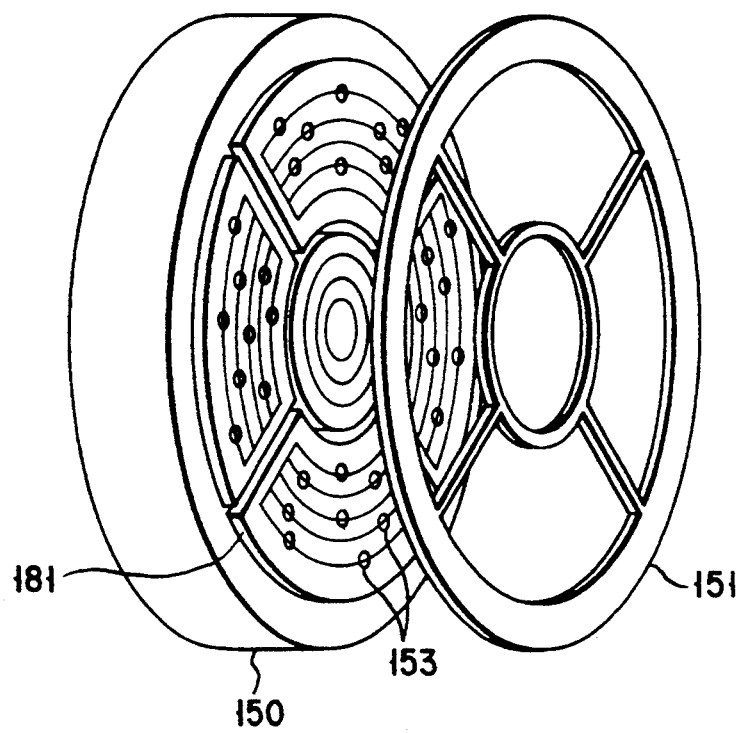
FIG. 25 is a perspective view illustrating a modified wafer holder and a modified support table which can be used in the substrate transfer device.

FIG. 25 shows another modification of the support table 150 and a modification of the wafer holder 151. As shown in FIG. 25, the modified support wafer holder 151 comprises an outer ring, an inner ring, and four connecting members connecting the rings together. The modified support table 150 has a groove 181 in its surface opposing the modified wafer holder 151. The groove 181 has a shape complementary to the wafer holder 151 and a depth slightly greater than the thickness of the wafer holder 151. When the wafer holder 151 is fitted in the grooves 181, the wafer W mounted on the holder 151 directly will contact the support table 150 and will be pneumatically attracted thereto. The wafer W can therefore be heated or cooled by the temperature-adjusting means (not shown) incorporated in the support table 150, more efficiently than would otherwise be the case.

Figure 26A:
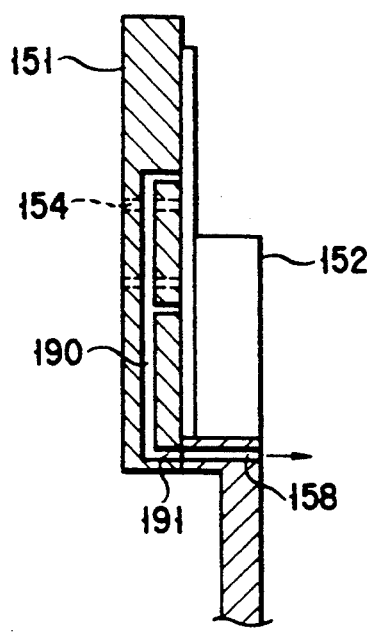
FIG. 26A is a sectional view of another modified wafer holder.
Figure 26B:
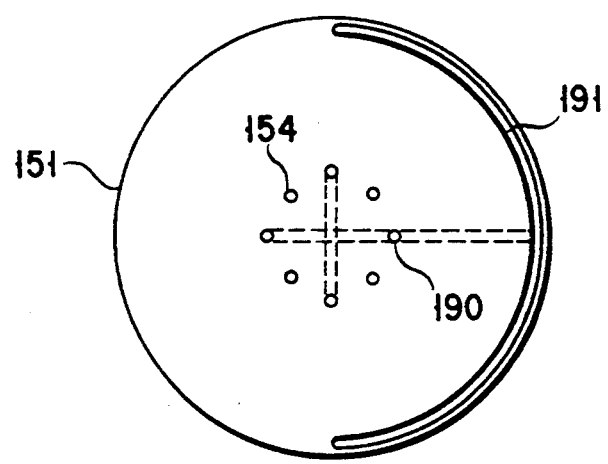
FIG. 26B is a plan view of the modified wafer holder shown in FIG. 26A.

FIGS. 26A and 26B show another modified wafer holder 151. As shown in these figures, the holder 151 has a gas passage 190 and four holes 191. The gas passage 190 communicates, at its closed-end portion, with the holes 191 which open in the surface opposing the transfer section 152. The gas passage 190 is connected at its open end to the suction hole 158 made in the ring-shaped member 152a of the transfer section 152. When the vacuum pump connected to the suction hole 158 is driven, negative pressure is created in the gas passage 190. As a result, the wafer W is attracted and secured to the wafer-holding surface of the wafer holder 151. The transfer section 152 transfers the wafer holder 151 toward the support table 150 until the holder 151 contacts the surface of the table 150. Thus, the wafer W can be attracted to the wafer holder 151, and the holder 151 can be attracted to the support table 150, by means of a vacuum system having a simple structure.

The wafer holder 151 may be secured to the transfer section 152 by any means other than the vacuum system. For example, the holder 151 may be attracted to the section 152 by means of a magnetic force or an electrostatic force. Alternatively, the wafer holder 151 may be secured to the transfer section 152 by using both the vacuum system and the magnetic means or the like.

A probe apparatus according to a fifth embodiment of the invention and which incorporates the substrate transfer device described above will be described with reference to FIGS. 27 and 28.

Figure 27:
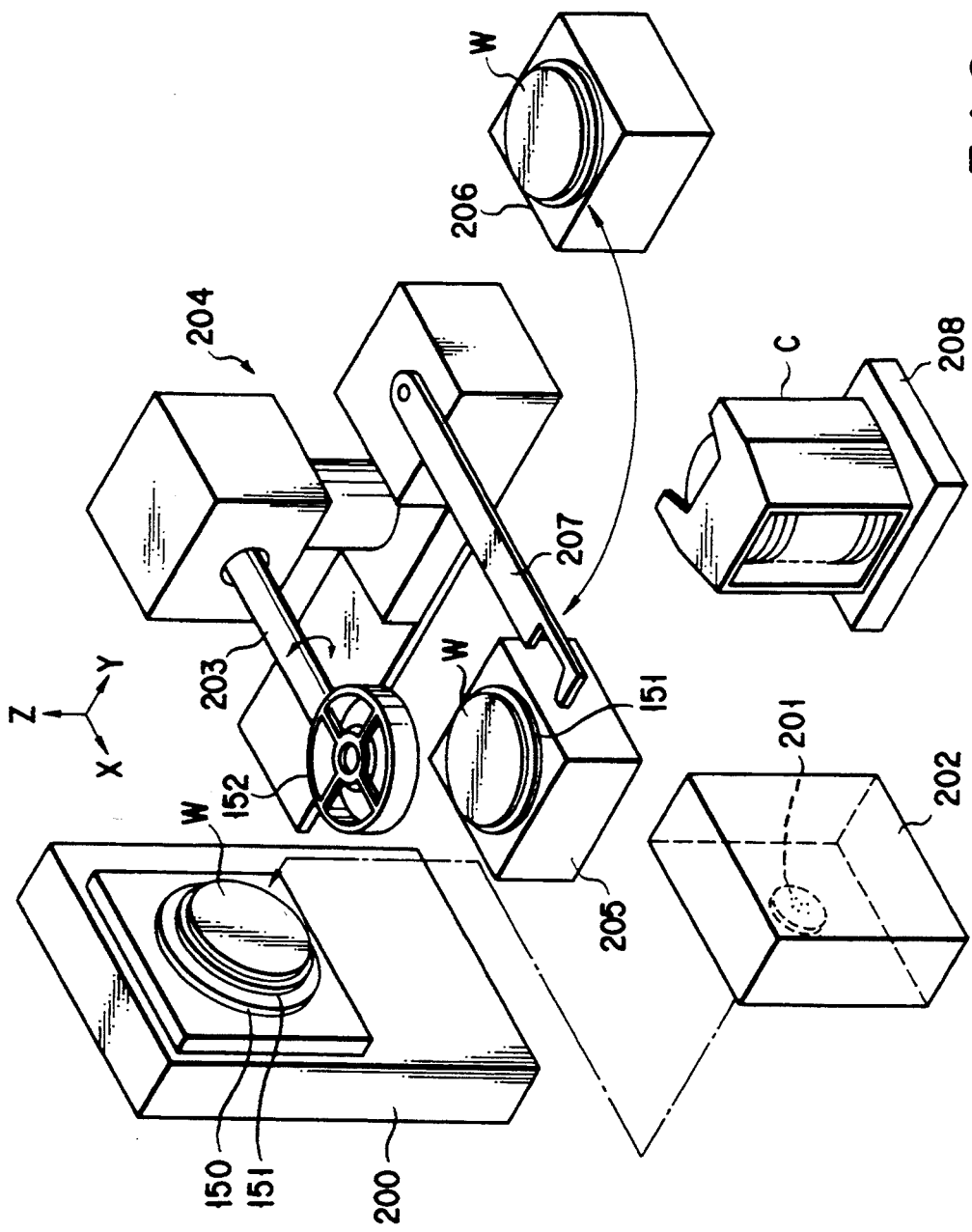
FIG. 27 is a perspective view of a probe apparatus according to a fifth embodiment of the present invention.

As shown in FIG. 27, the wafer holder 151 holding a wafer W is mounted on the support table 150. The support table 150 can be moved by a drive mechanism 200 in three directions X, Y, and Z. Further, the table 150 rotates around the Y axis of the probe apparatus. A test unit 202 is located opposing the support table 150. The test unit 202 comprises a probe card and a test head. The probe card has probes 201.

The transfer section 152 is fastened to the distal end of transfer arm 203. The transfer arm 203 is coupled to a drive mechanism 204. The mechanism 204 is designed to drive the arm 203 in the directions Y and Z and rotate around the X axis of the probe apparatus. The arm 203 is moved and rotated for specific distances and angles which have been determined in accordance with the layout of the components of the probe apparatus.

The probe apparatus comprises a wafer table 205, a pre-alignment stage 206, a handler 207, and a carrier stage 208. The wafer table 205 is used to support the wafer holder 151 holding the wafer W, either to be examined or already examined. The pre-alignment stage 206 is designed to align the orientation flat and the center of the wafer W with respect to reference positions. The handler 207 can rotate in the direction of arrow θ for transferring the wafer holder 151 and, hence, the wafer W from the wafer table 205 to the pre-alignment stage 206, and vice versa. The carrier stage 208 is provided for supporting a wafer carrier C.

As shown in FIG. 28, the wafer table 205 has thee pins P. The wafer table 205 has a horizontal suction passage and vertical holes communicating with the suction passage and opening at the upper surface. Air can be drawn by a vacuum pump (not shown) through the vertical holes and the suction passage, thereby to attract the wafer W onto the wafer holder 151. The pins P are biased, extending upwards from the upper surface of the table 205.

To transfer the wafer W onto the wafer holder 151, the pins P pass through the holes made in the wafer holder 151 and protrude upward from the upper surface of the wafer holder 151. When the wafer W is placed on the tips of the pins P, the pins P are pushed down against the bias force, into the holes made in the wafer table 205, as is illustrated in FIG. 28. The wafer W is thereby placed on the wafer holder 151. The vacuum pump is driven, drawing air from the wafer table 205 through the vertical holes and suction passage of the table 205. The wafer W is thereby attracted to the wafer holder 151, and the wafer holder 151 in turn is attracted to the wafer table 205.

To transfer the wafer W from the wafer holder 151, the operations described in the preceding paragraph are performed in the reverse order.

With the probe apparatus shown in FIG. 27, a transfer mechanism (not shown) removes a wafer W from the wafer carrier C and transfers the wafer W onto the pre-alignment stage 206. On the pre-alignment stage 206, the wafer W is pre-aligned. The handler 207 transfers the wafer W from the pre-alignment stage 206 to the wafer table 205 and places the wafer W on the wafer holder 151. Thereafter, the transfer section 152 is lowered to the wafer W until it contacts the wafer holder 151. The vacuum pump connected to the transfer section 151 is driven, whereby the holder 151 is attracted to the transfer section 152. Then, the transfer arm 203 is rotated around its axis, positioning the transfer section 122 vertically. This done, the arm 203 is moved in the direction Y, thereby transferring the wafer holder 151 onto the support table 150. The wafer W is aligned with respect to the probes 201 of the test unit 202. The wafer W is moved toward the test unit 202 until the probes 201 contact the bonding pads of the IC chips formed on the wafer W. Thus, the IC chips can be tested for their electrical characteristics. Also with the probe apparatus of FIG. 27, the test head which is a heavy component need not be moved to detect the electrical characteristics of the IC chips.

In order to secure the wafer holder 151 to the support table 150, while the holder 151 is holding the wafer W, the wafer W may be precisely positioned on the wafer holder 151 and then be aligned on the support table 150 with respect to the probes 201 of the probe card.

As has been described, with the probe apparatuses according to the present invention it is not necessary to move the test head (i.e., a heavy component) by a hinge mechanism as in the conventional probe apparatus. This ensures high-efficiency examination of semiconductor wafers. This also prevents the dust of oxide film, scraped by the probes from the bonding pads of the IC chips, from sticking to the surface of the wafer. Without dust of oxide film on the surface of the wafer, there will occur no thermal convection over the wafer, causing no quality degradation of the semiconductor wafer.

Since the test head is attached directly to the tester, electric signals are not delayed. Hence, high-frequency signals can be used to examine the electrical characteristics of the IC chips formed on the wafer.

In addition, the probe apparatuses of the present invention can be made compact and, hence, save space.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus comprising:
 a probe card having a plurality of probes;
 holding means located above or beside said probe card, for holding an object to be examined;
 a tester head electrically connected to the probes of said probe card;
 a tester electrically connected to said tester head, for detecting electrical characteristics of the object from data output from the object;
 imaging means arranged to oppose the object, for detecting a position of the object; and
 means for swinging said holding means to a first position where a surface of the object faces said probe card, or a second position where the surface of the object faces said imaging means.

2. The probe apparatus according to claim 1, further comprising scanning means for scanning the holding means swung to each of said first and second positions.

3. The probe apparatus according to claim 2, wherein said scanning means has a drive mechanism for driving said holing means in two directions in a horizontal plane, and a lift mechanism for moving said holding means in a vertical direction.

4. The probe apparatus according to claim 3, wherein said scanning means further comprises a fine drive mechanism for minutely moving said holding means in a vertical direction, and wherein said means for swinging includes a rotating mechanism for rotating said holding means in a plane.

5. The probe apparatus according to claim 1, wherein said holding means is located beside said probe card, and said object is set vertically in said first or second positions.

6. The probe apparatus according to claim 1, wherein said imaging means comprises a first imaging device having a low magnification and designed for pre-alignment of the object, and a second imaging device having a high magnification and designed for fine alignment of the object.

7. The probe apparatus according to claim 1, wherein said imaging means is a CCD camera unit.

8. The probe apparatus according to claim 1, further comprising marking means located to oppose the object which has been examined, for making marks to the object.

9. The probe apparatus according to claim 1, wherein said tester head and said tester are incorporated in the same housing.

10. The probe apparatus according to claim 1, wherein said holding means has suction means for pneumatically holding the object.

11. The probe apparatus according to claim 1, wherein said swinging means swings said holding means through an angle of about 90° or an angle of about 180°.

* * * * *